(12) United States Patent
Fukuhara et al.

(10) Patent No.: US 6,744,078 B2
(45) Date of Patent: Jun. 1, 2004

(54) HETEROJUNCTION STRUCTURE WITH A CHARGE COMPENSATION LAYER FORMED BETWEEN TWO GROUP III-V SEMICONDUCTOR LAYERS

(75) Inventors: Noboru Fukuhara, Tsukuba (JP); Hisashi Yamada, Sodegaura (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 10/187,648

(22) Filed: Jul. 3, 2002

(65) Prior Publication Data

US 2003/0006427 A1 Jan. 9, 2003

(30) Foreign Application Priority Data

Jul. 4, 2001 (JP) ........................................ 2001-202991

(51) Int. Cl.[7] ............................................. H01L 29/737
(52) U.S. Cl. ........................ 257/196; 257/198; 257/615
(58) Field of Search ............................ 257/11, 12, 183, 257/190, 196, 197, 198, 615

(56) References Cited

U.S. PATENT DOCUMENTS

| | | | |
|---|---|---|---|
| 5,258,624 A | * 11/1993 | Battersby et al. | 257/11 |
| 5,445,976 A | * 8/1995 | Henderson et al. | 438/319 |
| 5,682,040 A | 10/1997 | Imanishi | |
| 5,682,046 A | * 10/1997 | Takahashi et al. | 257/198 |
| 5,856,209 A | 1/1999 | Imanishi | |
| 5,952,672 A | 9/1999 | Kikkawa | |
| 6,043,520 A | * 3/2000 | Yamamoto et al. | 257/198 |
| 6,355,947 B1 | 3/2002 | Niwa | |
| 6,403,436 B1 | * 6/2002 | Tanomura | 438/312 |
| 6,563,145 B1 | * 5/2003 | Chang et al. | 257/197 |

FOREIGN PATENT DOCUMENTS

| | | |
|---|---|---|
| JP | 8-293505 A | 11/1996 |
| JP | 2000-68286 A | 3/2000 |
| JP | 2001-35859 A | 2/2001 |
| JP | 2001-326231 A | 11/2001 |

OTHER PUBLICATIONS

H. Suehiro et al., "Highly Doped InGaP/InGaAs/GaAs Pseudomorphic HEMT's with 0.35 um Gates," IEEE Transaction on Electron Devices vol. 41, No. 10, Oct. 1994.*

T. Tanaka et al., "Origin of Interface charge at spontaneously ordered GaInP and GaAs", The Tenth International Conference on Metalorganic Vapor Phase Epitaxy, (Jun. 5–9, 2000), pp. 307–308.

J. I. Song, et al, "Millimetre–wave InP/In GaAs heterojunction bipolar transistors with a subpicosecond extrinsic delay time," *Electronic Letters*, 3rd Mar. 1994, vol. 30, No. 5, pp. 456–457.

(List continued on next page.)

*Primary Examiner*—Erik J. Kielin
*Assistant Examiner*—Stephen W. Smoot
(74) *Attorney, Agent, or Firm*—Sughrue Mion, PLLC

(57) ABSTRACT

A thin film crystal wafer with pn-junction comprising a first layer of a first conductivity type which is a 3-5 group compound semiconductor represented by a general formula: $In_xGa_yAl_zP$ ($0 \leq x \leq 1$, $0 \leq y \leq 1$, $0 \leq z \leq$, $x+y+z=1$), and the second layer of a first conductivity type which is a 3-5 group compound semiconductor represented by a general formula: $In_xGa_yAl_z$As ($0 \leq x \leq 1$, $0 \leq y \leq 1$, $0 \leq z \leq 1$, $x+y+z=1$), said second layer being made above said first layer, and at a heterojunction interface formed between said first layer and said second layer, further comprising a charge compensation layer of a first conductivity type with an impurity concentration higher than that of said first and second layers.

8 Claims, 19 Drawing Sheets

OTHER PUBLICATIONS

J. I. Song, et al, "Characterisation of GaInP/GaAs double heterojunction bipolar transistors with different collector designs," *Electronic Letters*, 14th Oct. 1993, vol. 29, No. 21, pp. 1881–1883.

Q. J. Hartmann, et al, "Effect of Collector Design of the d.c. Characteristics of $In_{0.49}Ga_{0.51}P$/GaAs Heterojunction Bipolar Transistors," *Solid State Electronics*, vol. 38, No. 12, Dec., 1995, pp. 2017–2021.

P. Krispin, et al, "Interface properties of isotype GaAs/(In, Ga)P/GaAs heterojunctions grown by metalorganic–vapour–phase epitaxy on GaAs," *Journal of Crystal Growth*, vol. 220, No. 3, Dec. 2000, pp. 220–225.

Yong–Hwan Kwon, et al, "Effect of $GaAs_yP_{1-y}(0 \leq y < 1)$ interlayers on the structural, optical, and electrical characteristics of GaAs/InGaP heterojunction," *Applied Physics Letters*, vol. 76, No. 17, Apr. 24, 2000, pp. 2379–2381.

* cited by examiner

IC(IB)N-VB

WITHOUT CHARGE COMPENSATION LAYER

HFE-IC

WITHOUT CHARGE COMPENSATION LAYER

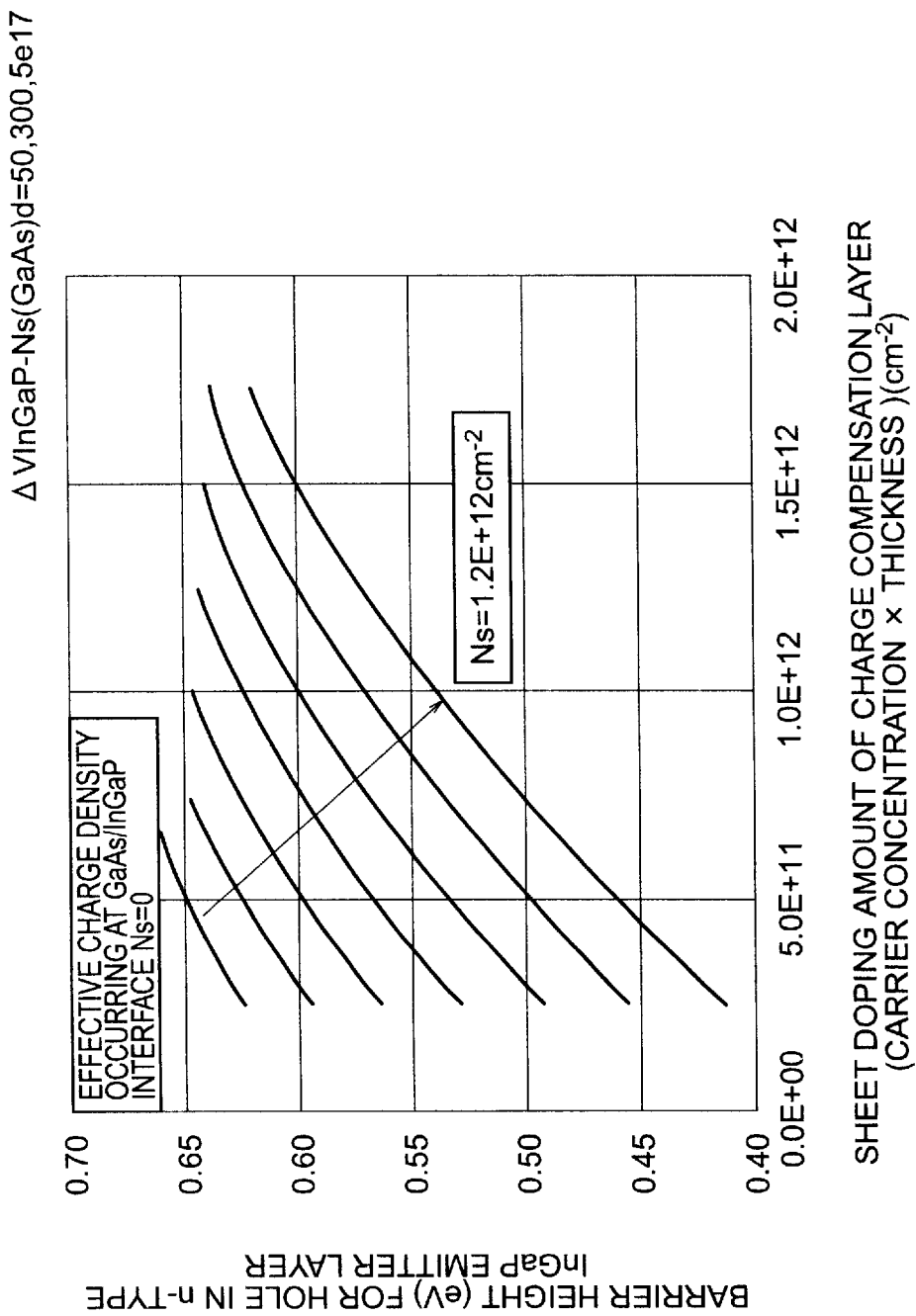

HBT I-V CHARACTERISTICS
COLLECTOR CURRENT AND BASE CURRENT VS.
EMITTER-BASE VOLTAGE CHARACTERISTICS

EMITTER-BASE REVERSE I-V CHARACTERISTICS

HBT I-V CHARACTERISTICS
COLLECTOR CURRENT AND BASE CURRENT VS.
EMITTER-BASE VOLTAGE CHARACTERISTICS

EMITTER-BASE REVERSE I-V CHARACTERISTICS

AMOUNT OF CHARGE OCCURRING AT GaAs/InGaP INTERFACE & RANGE OF APPROPRIATE SHEET DOPING AMOUNT OF CHARGE COMPENSATION LAYER

AMOUNT OF DOPING OF CHARGE COMPENSATION LAYER AND $\Delta Eg$

DEPENDENCY ON THICKNESS OF n⁻TYPE InGaP LAYER (EMITTER A LAYER)

DEPENDENCY ON DOPING CONCENTRATION OF n⁻TYPE InGaP LAYER (EMITTER A LAYER)

FIG. 19

| | CARRIER CONCENTRATION | DOPANT | THICKNESS(nm) | In COMPOSITION |
|---|---|---|---|---|
| EMITTER CONTACT B LAYER | n-TYPE InGaAs LAYER | 2.00 E+19 | Si | 100 | 0.55 |
| EMITTER CONTACT A LAYER | n-TYPE GaAs LAYER | 3.00 E+18 | Si | 100 | |
| EMITTER B LAYER | n-TYPE GaAs LAYER | 3.00 E+17 | Si | 100 | |
| CHARGE COMPENSATION LAYER | n-TYPE GaAs LAYER | 3.00 E+18 | Si | 3 | |
| EMITTER A LAYER | n-TYPE InGaP LAYER | 3.00 E+17 | Si | 30 | 0.48 |
| BASE LAYER | p-TYPE GaAs | 4.00 E+19 | C | 80 | |
| COLLECTOR LAYER | NON-DOPED GaAs | | | 500 | |
| COLLECTOR CONTACT LAYER | n-TYPE GaAs LAYER | 3.00 E+18 | Si | 500 | |
| BUFFER LAYER | | | | | |
| S.I.GaAs SUBSTRATE | | | | | |

FIG. 20

| | CARRIER CONCENTRATION | DOPANT | THICKNESS (nm) | In COMPOSITION |
|---|---|---|---|---|
| EMITTER CONTACT B LAYER | n-TYPE InGaAs LAYER | 2.00 E+19 | Si | 100 | 0.55 |
| EMITTER CONTACT A LAYER | n-TYPE GaAs LAYER | 3.00 E+18 | Si | 100 | |
| EMITTER B LAYER | n-TYPE GaAs LAYER | 3.00 E+17 | Si | 100 | |
| CHARGE COMPENSATION LAYER | n-TYPE GaAs LAYER | 3.00 E+18 | Si | 5 | |
| EMITTER A LAYER | n-TYPE InGaP LAYER | 3.00 E+17 | Si | 30 | 0.48 |
| BASE LAYER | p-TYPE GaAs | 4.00 E+19 | C | 80 | |
| COLLECTOR LAYER | NON-DOPED GaAs | | | 500 | |
| COLLECTOR CONTACT LAYER | n-TYPE GaAs LAYER | 3.00 E+18 | Si | 500 | |
| BUFFER LAYER | | | | | |
| S.I. GaAs SUBSTRATE | | | | | |

HBT I-V CHARACTERISTICS
COLLECTOR CURRENT AND BASE CURRENT VS.
EMITTER-BASE VOLTAGE CHARACTERISTICS

EMITTER-BASE REVERSE I-V CHARACTERISTICS

FIG. 22

| | | CARRIER CONCENTRATION | DOPANT | THICKNESS (nm) | In COMPOSITION |
|---|---|---|---|---|---|
| EMITTER CONTACT B LAYER | n-TYPE InGaAs LAYER | 2.00 E+19 | Si | | 0.55 |
| EMITTER CONTACT A LAYER | n-TYPE GaAs LAYER | 3.00 E+18 | Si | | |
| EMITTER B LAYER | n-TYPE GaAs LAYER | 3.00 E+17 | Si | | |
| EMITTER A LAYER | n-TYPE InGaP LAYER | 3.00 E+17 | Si | 30 | 0.48 |
| BASE LAYER | p-TYPE GaAs | 4.00 E+19 | C | 80 | |
| COLLECTOR LAYER | NON-DOPED GaAs | | | 500 | |
| COLLECTOR CONTACT LAYER | n-TYPE GaAs LAYER | 3.00 E+18 | Si | 500 | |
| BUFFER LAYER | | | | | |
| S.I.GaAs SUBSTRATE | | | | | |

HBT I-V CHARACTERISTICS
COLLECTOR CURRENT AND BASE CURRENT VS.
EMITTER-BASE VOLTAGE CHARACTERISTICS

EMITTER-BASE REVERSE I-V CHARACTERISTICS

FIG. 24

| | CARRIER CONCENTRATION | DOPANT | THICKNESS (nm) | In COMPOSITION |
|---|---|---|---|---|
| EMITTER CONTACT B LAYER | n-TYPE InGaAs LAYER | 2.00 E +19 | Si | | 0.55 |
| EMITTER CONTACT A LAYER | n-TYPE GaAs LAYER | 3.00 E +18 | Si | | |
| EMITTER A LAYER | n-TYPE InGaP LAYER | 3.00 E +17 | Si | 30 | 0.48 |
| BASE LAYER | p-TYPE GaAs | 4.00 E +19 | C | 80 | |
| COLLECTOR LAYER | NON-DOPED GaAs | | | 500 | |
| COLLECTOR CONTACT LAYER | n-TYPE GaAs LAYER | 3.00 E +18 | Si | 500 | |
| BUFFER LAYER | | | | | |
| S.I.GaAs SUBSTRATE | | | | | |

HETEROJUNCTION STRUCTURE WITH A CHARGE COMPENSATION LAYER FORMED BETWEEN TWO GROUP III-V SEMICONDUCTOR LAYERS

BACKGROUND OF THE INVENTION (1) Field of the Invention

This invention relates to a thin film crystal wafer with pn-junction and its manufacturing process, in particular, a thin film crystal wafer that is suitable for manufacture of InGaP/GaAs heterojunction bipolar transistor (HBT).

(2) Description of the Related Art

The heterojunction bipolar transistor (HBT) has a heterojunction emitter-base junction, in order to increase emitter injection efficiency, the emitter layer of which is made of a substance with a greater band gap than a substance used for the base layer. Such a transistor is suitable for a semiconductor element that is used in the range of high frequencies and is expected to become a semiconductor element for the next generation of portable telephones. The reasons for such an expectation are that the transistor can be driven with a single power supply, is highly efficient and has a low distortion property. The InGaP HBT has especially been attracting attention, because, compared with AlGaAs-HBT which is currently the most developed, it is characterized by 1) being harder to be oxidized, capable of producing a higher purity crystal, 2) has a greater valence band offset from GaAs, capable of generating less holes injection to emitter region, 3) having no deep level DX center which is characteristic of semiconductors of 3-5 group compound semiconductors, 4) having a lower interfacial recombination velocity, and 5) having a greater etching selectivity, hence being more favorable in device processing.

The InGap/GaAs HBT is manufactured, for example, by forming a thin film crystal wafer, the pn-junction, or emitter-base junction of which has a heterojunction structure by inducing crystal growth of, in succession, $n^+$-type GaAs layer, n-type GaAs layer (collector layer), p-type GaAs layer (base layer), n-type InGaP layer (emitter layer) and n-type GaAs layer (cap layer) on a semi-insulating GaAs substrate by the organometallic pyrolysis (MOVPE) method.

In HBT made using InGaP thin film crystal wafer, the structure of which is described above, depletion of carrier electron is known to occur from the heterojunction interface between the n-type InGaP layer (emitter layer) and n-type GaAs layer (cap layer) when the wafer is formed by inducing crystal growth of, in succession, the n-type InGaP layer (emitter layer) and the n-type GaAs layer (cap layer). It has been pointed out that when the depletion of carrier electrons occurs, there arises the problem of increasing emitter resistance and deteriorating element properties including high frequency properties.

In order to solve this problem, an impurity layer such as a Si layer with low diffusion coefficient is produced at the above-mentioned heterojunction interface by using the technique of planar doping, in which the supply of 3-group raw materials is stopped to discontinue the crystallization growth, an impurity is introduced onto the surface, and a very thin film impurity layer is formed. The structure to which an impurity is introduced to solve the problem of deterioration of emitter resistance due to depletion of carrier electron is described, for example, in the JP-A-8-293505.

The planar doping contains a process of desorption of impurity at the time of stopping the supply of 3-group raw materials and adsorption of impurity onto the surface of crystal in an atmosphere of 5-group raw material. Therefore, the amount of impurity is affected not only by the amount of supply of Si but also by a growth temperature, a partial pressure of 5-group raw material and the way of switching gas during a period from the completion of the planar doping to the starting of growth of the next layer. Activation rates of impurity change according to manufacturing conditions, since a large quantity of impurity atoms are introduced to the very thin film and hence induce defects. In addition, the thickness of the doped layer is difficult to control since atoms on the surface tend to segregate. Subsequently, with the introduction of impurity in planar doping, as compared to the formation of an ordinary impurity doped layer, it is more difficult to control the doping amount and the thickness of the diffusion film, thereby aggravating in-plane uniformity and reproducibility. For the purpose of stable manufacture of thin film crystal wafers, planar doping is disadvantageous as compared to the formation of the ordinary doping layer to which impurity is introduced during crystal growth.

At the time of formation of the planar doping layer on the above-described heterojunction interface, the crystal growth is discontinued on the surface of the InGaP layer and impurities such as Si are introduced in a phosphine atmosphere. In the next growth, the 5-group element is replaced with arsine to form an epitaxial layer. It is known that since the decomposition pressure of P in the crystal layer is higher than that of As, the InGaPAs layer, a transition layer, is formed on the interface when the InGaP layer is replaced with the GaAs layer. This is another problem that aggravates the controllability of planar doping.

Furthermore, the present inventors eagerly studied the above-described problems and have found that the phenomenon of depletion of carriers occurring at the heterojunction interface between the InGaP layer and the GaAs layer does not only create the problem of increase in emitter resistance of the heterojunction bipolar transistor but also of increase in base current at a region with a relatively low voltage between the emitter and base, that is, a region with a low collector current density.

The increase in base current manifests as decrease in current gain in a low collector current density. When devices with such characteristics are used as an amplifier for communication, performances such as electric power efficiency and distortion property at low output are aggravated.

SUMMARY OF THE INVENTION

The purpose of this invention is to provide a thin film crystal wafer with an improved pn-junction that can solve the above-mentioned problems in the prior art as well as a process for manufacture thereof.

According to this Invention, by forming a charge compensation layer between the n-type InGaP layer which serves as the emitter layer of HBT, and the GaAs layer which is formed above the former, the increase in base current due to the phenomenon of depletion of carriers at the interface is suppressed, thereby preventing the decrease in current gain in low collector current in HBT.

In addition, when the amount of n-type impurity introduced in order to lessen the influence of the depletion phenomenon is excessive, the breakdown voltage in the reverse bias between the emitter and base will be decreased. By regulating quantitatively the amount of n-type impurity, while the breakdown voltage between the emitter and base is maintained, the decrease in current gain in low collector current is prevented. Thus, a thin film crystal wafer with pn-junction can be provided, which has satisfactory reproducibility and productivity.

The first mode of this invention is a thin film crystal wafer with pn-junction, comprising a first layer of a first conductivity type which is a 3-5 group compound semiconductor represented by a general formula: $In_xGa_yAl_zP$, ($0 \leq x \leq 1$, $0 \leq y \leq 1$, $0 \leq z \leq 1$, x+y+z=1), and the second layer of a first conductivity type which is a 3-5 group compound semiconductor represented by a general formula: $In_xGa_yAl_zAs$ ($0 \leq x \leq 1$, $0 \leq y \leq 1$, $0 \leq z \leq 1$, x+y+z=1), said second layer being made above said first layer, and at a heterojunction interface formed between said first layer and said second layer, further comprising a charge compensation layer of a first conductivity type with an impurity concentrations higher than that of said first and second layers.

The second mode of this invention is a thin film crystal wafer with pn-junction, described in the above first mode, further comprising a collector layer and a base layer wherein said first layer is a semiconductor layer which serves as an emitter layer with a bandgap energy larger than said base layer.

The third mode of this invention is a thin film crystal wafer with pn-junction described in the above first or second mode, wherein said first layer is an n-type InGaP layer and said second layer is an n-type $Al_xGa_yAs$ layer ($0 \leq X \leq 1$, $0 \leq Y \leq 1$, X+Y=1).

The fourth mode of this invention is a thin film crystal wafer with pn-junction described in the above first, second or third mode, wherein an n-type impurity is Si.

The fifth mode of this invention is a thin film crystal wafer with pn-junction described in the first, second, third or fourth mode, wherein said charge compensation layer has a thickness of not more than 15 nm and doping amount is greater than $1 \times 10^{18}$ cm$^{-3}$.

The sixth mode of this invention is a thin film crystal wafer with pn-junction described in the above first, second, third, fourth or fifth mode, wherein said first layer has a thickness of not more than 60 nm.

The seventh mode of this invention is a thin film crystal wafer with pn-junction described in the above first, second, third, fourth, fifth or sixth mode, wherein a carrier concentration and thickness of said charge compensation layer are controlled depending on a bandgap energy of said first layer.

The eighth mode of this invention is a thin film crystal wafer with pn-junction described in the above first, second, third, fourth, fifth, sixth or seventh mode, wherein sheet doping amount Ns (cm$^{-2}$) that is a product of carrier concentration and thickness of said charge compensation layer satisfies:

$$(180 \times \Delta Eg + 3.0) \times 1E11 \times C1 > Ns > (160 \times \Delta Eg - 4.6) \times 1E11 \times C2$$

wherein $\Delta Eg = (1.92 - (Eg + 1 \times y))$, $C1 = ((dInGaP/30)^{(-1.0)}) \times (-2.1E-17 \times Ndemitter + 26.8)/16.2 \times (1.2 \times dn + GaAs + 9.8)/15.7$ $C2 = ((dInGaP/30)^{(-1.59)}) \times (-1.7E-18 \times Ndemitter + 14.9)/6.5 \times (0.61 \times dn + GaAs + 3.5)/6.6 \times (-7.5E-18 \times NdGaAs + 10.4)/6.6$ wherein Eg is a bandgap energy of the first layer at room temperature (eV), $\Delta y$ is a result of subtraction of a value of In composition of the first layer when the first layer coincides with the second layer in lattice constants from a value of the In composition of said first layer, dInGaP is a thickness of the first layer (nm), Ndemitter is a carrier concentration of the first layer (cm$^{-3}$), dn+GaAs is a thickness of a charge compensation layer (nm) and NdGaAs is a carrier concentration of the second layer (cm$^{-1}$).

The ninth mode of this invention is a thin film crystal wafer with pn-junction described in the above first, second, third, fourth, fifth, sixth, seventh or eighth mode, wherein epitaxial growth of each of said layers is performed in organometallic vapor-phase growth method.

This invention provides the above-described structure wherein on the heterojunction interface formed by the first layer of a first conductivity type which is a 3-5-group compound semiconductor represented by the general formula: $In_xGa_yAl_zP$ ($0 \leq x \leq 1$, $0 \leq y \leq 1$, $0 \leq z \leq 1$, x+y+z=1) and the second layer, made above said first layer, of a first conductivity type which is a 3-5-group compound semiconductor represented by the general formula: $In_xGa_yAl_zAs$ ($0 \leq x \leq 1$, $0 \leq y \leq 1$, $0 \leq z \leq 1$, x+y+z=1), there is provided a charge compensation layer of a first conductivity type with an impurity concentration higher than that of said first and second layers. Consequently, depletion of carrier at the above junctional interface can be compensated to increase the carrier concentrations, whereby the formation of a high resistance layer at the junction interface is prevented and increase in base current is suppressed. As a result, decrease in current gain is suppressed. Thus, the characteristics of HBT can be markedly improved. Since the charge compensation layer is composed to have an appropriate thickness, the compensation of carrier depletion can be maintained in a stable manner. Thus, the stabilization of characteristics can be expected.

BRIEF DESCRIPTION OF THE DRAWINGS

FIG. 9 is a graph demonstrating a relationship between potential in the emitter layer and the doping amount of the charge compensation layer.

FIG. 19 is a table summarizing data on layers in Example 1.

FIG. 20 is a table summarizing data on layers in Example 2.

FIG. 22 is a table summarizing data on layers in Comparative Example 1.

FIG. 24 is a table summarizing data on layers in Comparative Example 2.

DESCRIPTION OF THE PREFERRED EMBODIMENTS

One embodiment of this invention is explained in detail in reference to Figures.

Figure 1:
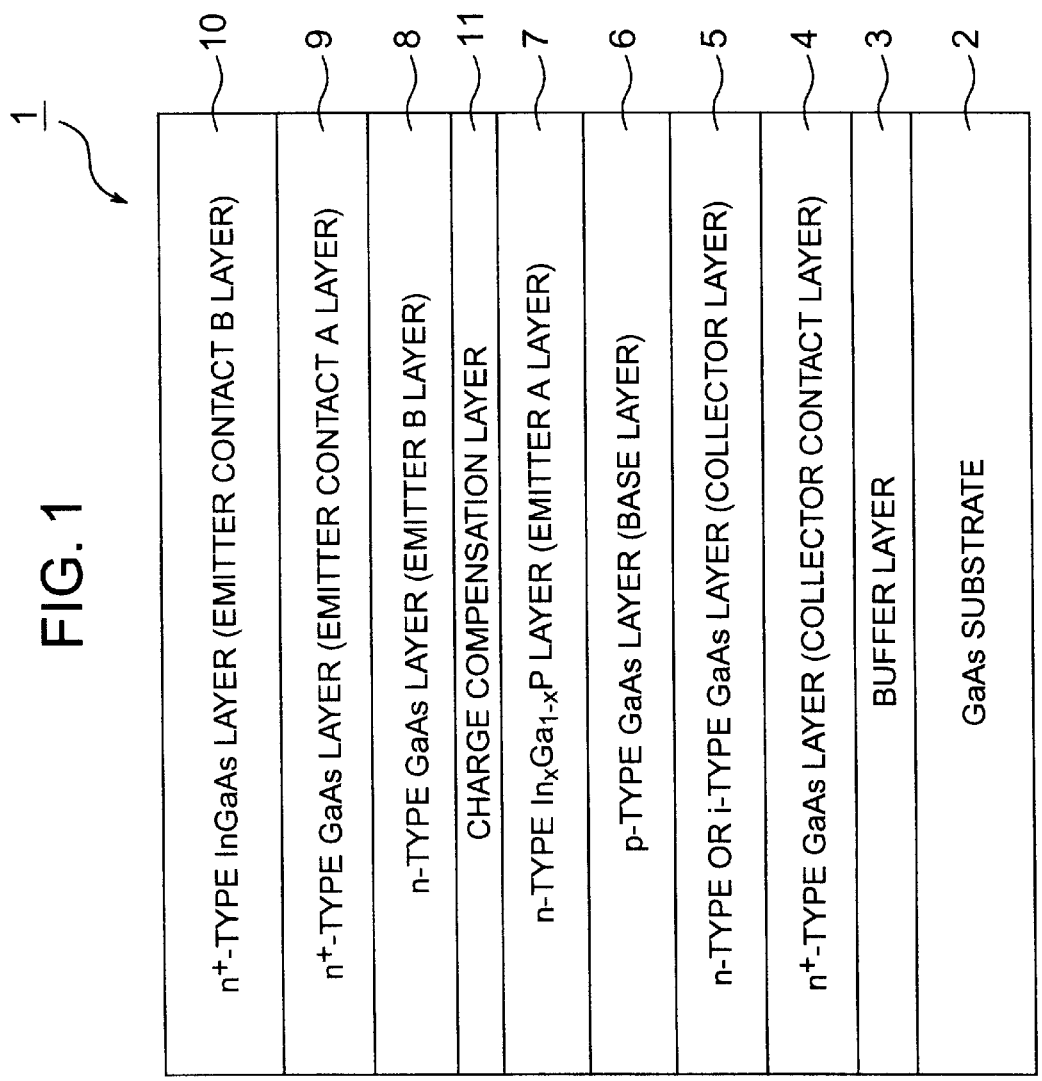
FIG. 1 is a cross section of an example of the thin film crystal wafer with pn-junction for HBT of this invention.

FIG. 1 is a cross section of an example of the thin film crystal wafer with pn-junction for HBT of this invention. The thin film crystal wafer is used for the manufacture of HBT. The wafer is formed in the organometallic vapor phase epitaxy (MOVPE) on a GaAs substrate (2) that is a semi-insulating GaAs compound semiconductor crystal by using plural semiconducting thin film crystal layers as described below.

In other words, the thin film crystal wafer (1) comprises a GaAs substrate (2), a buffer layer (3) formed above (2), an n$^+$-type GaAs layer (4) as a collector contact layer, an n-type or non-doping i-type GaAs layer (5) as a collector layer, a p-type GaAs layer (6) as a base layer, an n-type In$_x$Ga$_{1-x}$P layer (7) that is an emitter A layer as an emitter layer, and a charge compensation layer (11) formed above (7). Then, the thin film crystal wafer (1) further comprises an n-type GaAs layer (8) that is an emitter B layer with an impurity concentration similar or lower than that of the emitter A layer or the n-type In$_x$Ga$_{1-x}$P layer (7) in order to decrease the emitter capacity between the emitter and base, to improve breakdown voltage and to more suppress current convergence induced by temperature non-uniformity due to generation of heat, an n$^+$-type GaAs layer (9) that is an emitter contact A layer with an impurity concentration relatively higher than that of the n-type In$_x$Ga$_{1-x}$P layer (7) of the emitter layer A in order to decrease the contact resistance against the emitter electrodes, and an n$^+$-type InGaAs layer (10) that is an emitter contact B layer with a higher impurity concentration.

The impurity concentration of the charge compensation layer (11) is higher than that of the n-type In$_x$Ga$_{1-x}$P layer (7) that is the emitter A layer or the n-type GaAs layer (8) that is the emitter B layer.

The charge compensation layer (11) is provided to prevent the increase in base current of HBT, or the aggravation of current gain property of HBT, that is induced by the depletion phenomenon of carrier electrons at the heterojunction interface formed by the n-type In$_x$Ga$_{1-x}$P layer (7) and the n-type GaAs layer (8).

The present inventors have found that the depletion phenomenon of carrier electrons that occurs when the AlGaAs layer or GaAs layer is formed on the In GaP layer induces the aggravation of current gain property due to increases in base current at a region of a relatively low voltage between the emitter and base of the heterojunction bipolar transistor (HBT), and that the problem can be solved by inserting the charge compensation layer into the heterojunction interface. Furthermore, the inventors could quantitatively determine the impurity that should be added to the charge compensation layer by analyzing the phenomenon.

Figure 2:
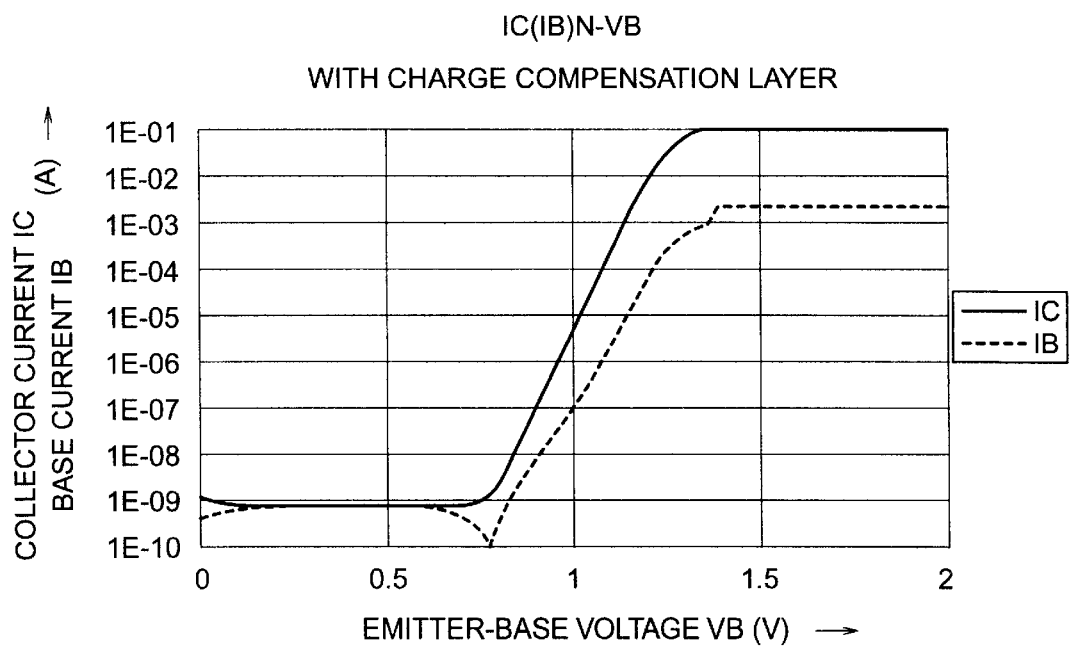
FIG. 2 is a graph demonstrating transistor characteristics of HBT with a thin film crystal wafer shown in FIG. 1.
Figure 3:
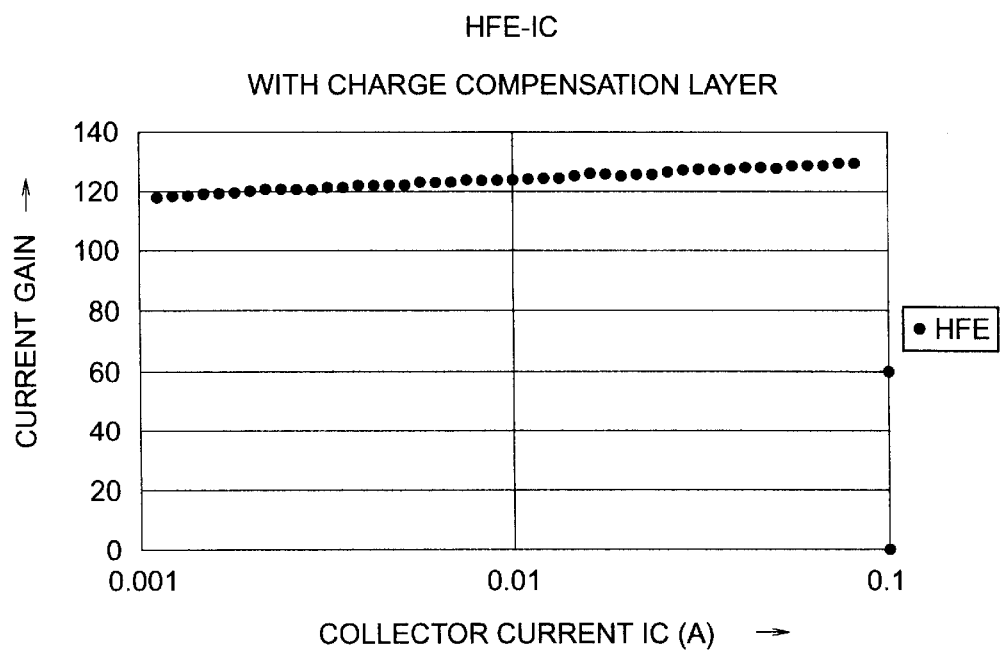
FIG. 3 is a graph demonstrating other transistor characteristics of HBT with a thin film crystal wafer shown in FIG. 1.

FIGS. 2 and 3 demonstrate the results of measurement of the characteristics of HBT that was manufactured using the thin film crystal wafer (1), the structure of which is shown in FIG. 1. FIG. 2 is a graph demonstrating the characteristics of change in collector current IC and base current IB when base voltage VB is changed from 0V to 2 V. FIG. 3 is a graph demonstrating the changes in current gain HFE against the changes in the collector current IC. The graph shows the current gain HFE is kept almost constant in relative to the changes in the collector current IC. In FIG. 2, 1×10$^{-1}$ is expressed as 1E-01. Likewise, P×10$^Q$ is expressed as PEQ or PeQ in the specification and drawings.

In the embodiment shown in FIG. 1, the charge compensation layer (11) above the n-type In$_x$Ga$_{1-x}$P layer (7) is a GaAs layer with a high concentration of Si doped as the donor impurity. It is also possible to use an In$_x$Ga$_{1-x}$P layer or an Al$_x$Ga$_{1-x}$As layer as the charge compensation layer (11).

Figure 4:
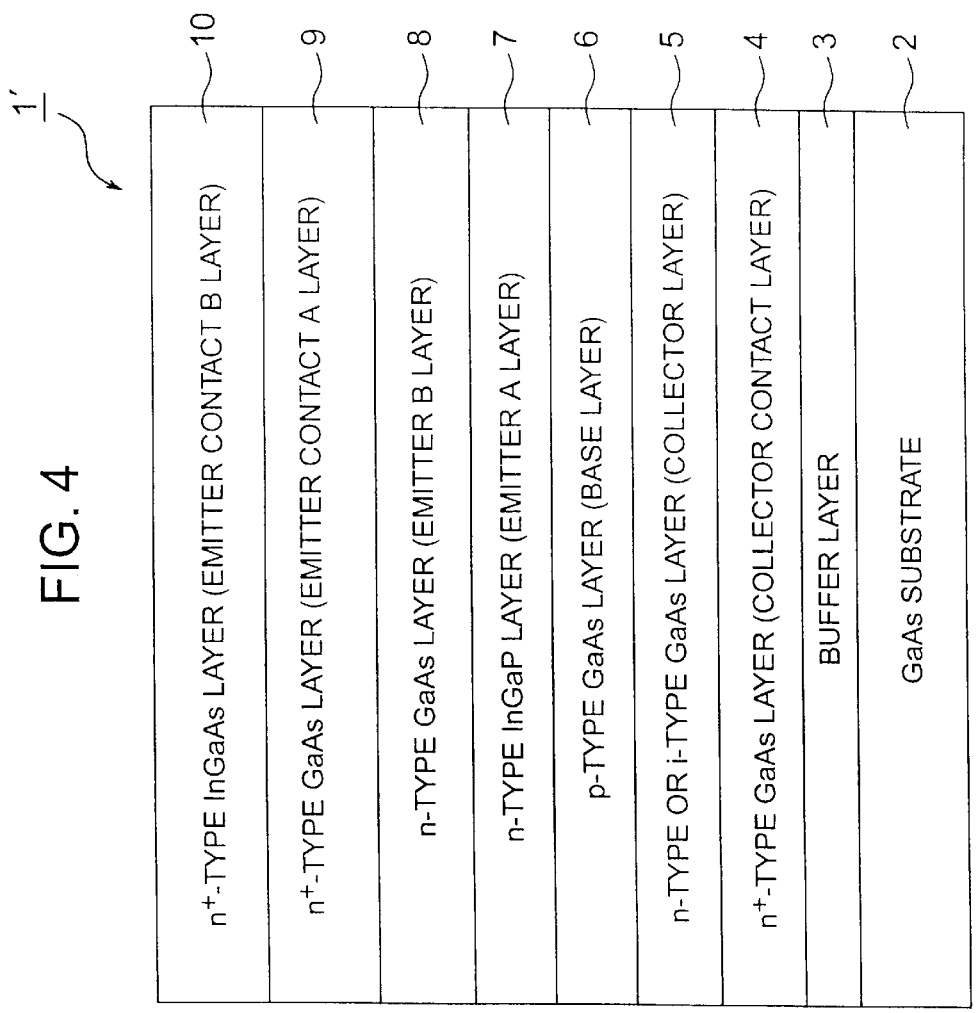
FIG. 4 is a cross section of an example of a thin film crystal wafer with pn-junction for HBT that is not provided with a charge compensation layer.
Figure 5:
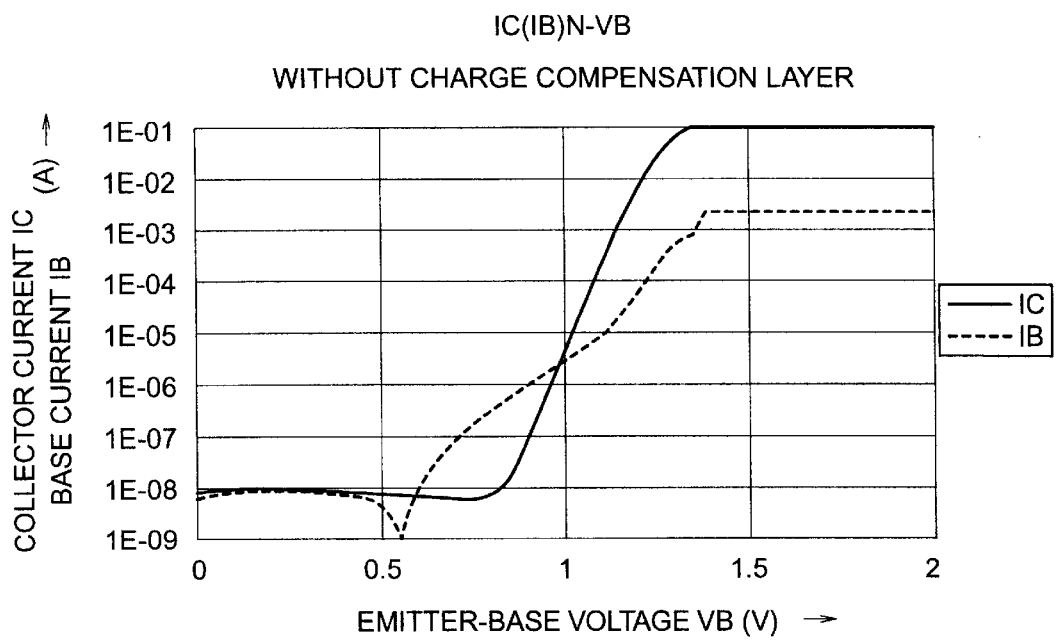
FIG. 5 is a graph demonstrating transistor characteristics of HBT with a thin film crystal wafer shown in FIG. 4.

For the purpose of comparison, FIG. 4 shows the structure of a thin film crystal wafer with pn-junction (1') for the conventional HBT shown in FIG. 1 but without the charge compensation layer (11). Results of measurement of the characteristics of the thin film crystal wafer (1') shown in FIG. 4 are summarized in FIGS. 5 and 6. FIG. 5 corresponds to FIG. 2 and FIG. 6 to FIG. 3.

Figure 6:
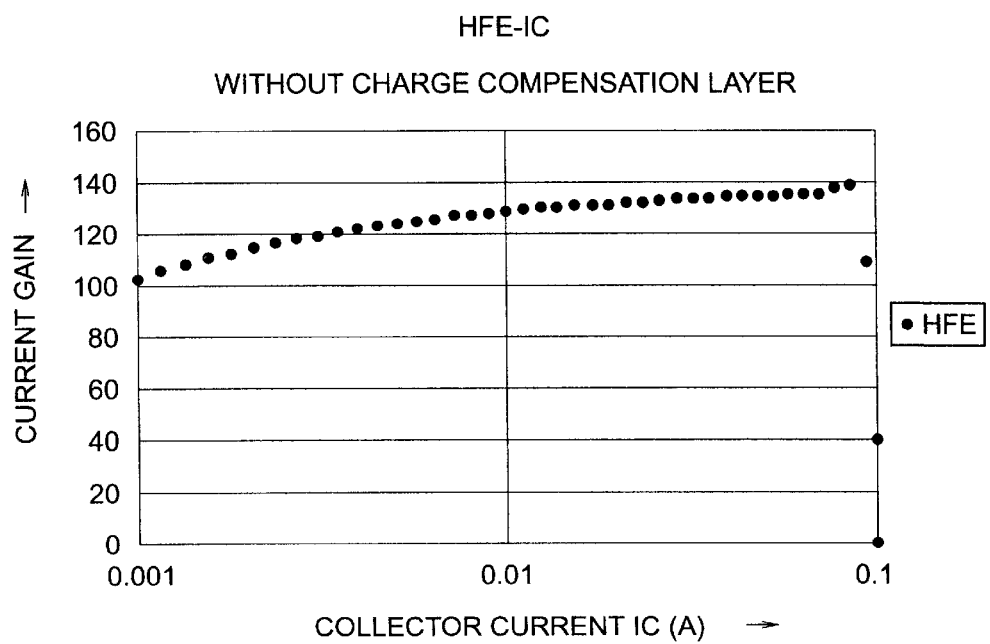
FIG. 6 is a graph demonstrating other transistor characteristics of HBT with a thin film crystal wafer shown in FIG. 4.

In FIG. 5, the axis of abscissas indicates the emitter-base base voltage (base voltage) VB and the axis of ordinates indicates the collector current IC (solid line) and the base current IB (broken line). The emitter-collector voltage was set at 2V. In FIG. 6, the axis of abscissas indicates the collector current and the axis of ordinates indicates the current gain HFE. The emitter size of HBT is 100 μm×100 μm. Measurement conditions of FIGS. 2 and 3 are the same as those of FIGS. 5 and 6.

In FIG. 5 demonstrating the characteristics of HBT without the charge compensation layer (11), the collector current increases against VB voltage when VB exceeds 0.8 V in the same manner as in FIG. 2 demonstrating the characteristics of HBT with the charge compensation layer (11). This collector current increase is ideal. (When the emitter-base voltage VB is 0.8 V or less, leak current appears between the base and collector. And the collector current IC is saturated at 1×10$^{-1}$ A, this occurred outside the range of measurement.

These are not essential.) However, the base current IB in FIG. 5 shows a difference in dependency on VB between a region of VB above 1.1V and a region of VB below 1.1V. While IB shows the same characteristics as that in FIG. 3 when VB is above 1.1V, the IB is greater than that in FIG. 3 when VB is below 1.1V. The increases are approximately by one figure to two figures when VB is around 0.8V. It demonstrates that insertion of the charge compensation layer (11) lowers the base current IB.

Because of the decreases in base current IB, the current gain HFE is markedly improved in a region of a small collector current IC when HFE with the charge compensation layer shown in FIG. 3 is compared with that without the charge compensation layer shown in FIG. 6.

Next, the mechanism of increase and decrease in base current is explained. The depletion phenomenon of carrier electrons that occurs when the AlGaAs layer or GaAs layer is formed on the InGaP layer is caused by the energy increase of the conduction band bottom against electrons at the heterojunction interface between the InGaP layer and AlGaAs layer or GaAs layer. In other words, when the AlGaAs layer or GaAs layer is formed above the InGaP layer of the emitter layer of heterojunction bipolar transistor, the energy of the top of the valence band at the heterojunction interface decreases against holes. Consequently, the hole current from the base layer to the emitter layer increases at a region of a relatively low voltage between the emitter and base. Insertion of the charge compensation layer into the heterojunction interface between the InGaP layer and AlGaAs layer or GaAs layer enables compensation of the carrier depletion and prevents decreases in barrier energy of the InGaP layer against the holes.

It is known as described in JP-A-11-243058 that there is an association between the phenomenon of the carrier depletion and the formation of natural superlattice of the InGaP layer. The natural superlattice of the InGaP layer means the state in which on the specific crystal plane formed in the mixture of In atoms and Ga atoms, planes that have more In concentration than the average mixing ratio are formed alternately with planes that have more Ga concentration than the average mixing ratio. In such a state, the larger deviation from the average mixing ratio is at each surface, the stronger the degree of ordering is. It is not clear what kind of mechanism in the formation of natural superlattice causes the depletion phenomenon.

T. Tanaka et al. (Workbook of the Tenth International Conference on Metalorganic Vapor Phase Epitaxy, Sapporo, Japan: 307, 2000) reported that on the hetero-interface of the InGaP layer which is opposite to the side where the depletion occurs, electrons are accumulated and the stronger the degree of ordering at the natural superlattice is, the greater the charge is. T. Tanaka et al. also discussed on the association between the occurrence of natural superlattice on the InGaP layer and the polarization induced by piezoelectric effect.

Figure 7:
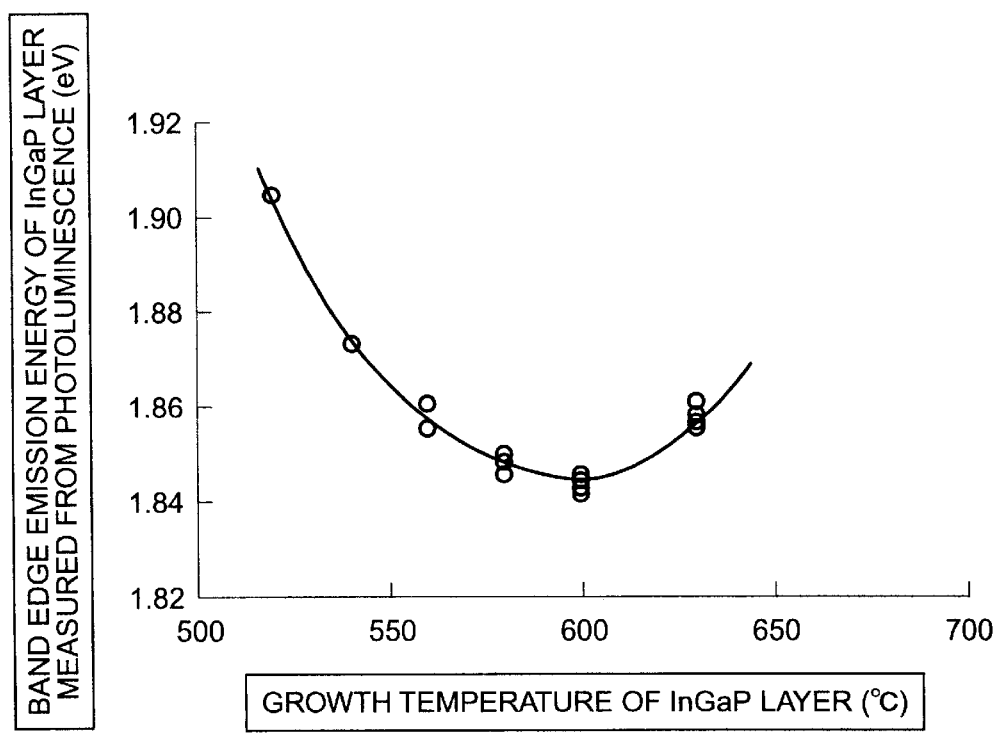
FIG. 7 demonstrates characteristics of emission energy at the band edge of the InGaP layer.

It is known that the bandgap energy of the InGap Layer changes depedning on the degree of ordering of the natural superlattice of the InGaP layer. FIG. 7 is a graph of the results of measurement of photoluminescence at room temperature demonstrating a relationship between the emission energy at the band edge of the InGaP layer and the growth temperature, which is a factor of crystal growth. This energy nearly corresponds to the energy of the bandgap. Observation with electron beam diffraction analysis has confirmed that a correlation between the degree of ordering of the natural superlattice and the band edge emission energy. If the lattice constant of InGaP layer is coincident to that of GaAs, the bandgap energy of the InGaP layer without ordering is said to be about 1.92 eV.

The degree of ordering of the natural superlattice can be inferred based on the bandgap energy of the InGaP layer at room temperature, that is the band edge emission energy obtained from the photoluminescence measurement.

Figure 8:
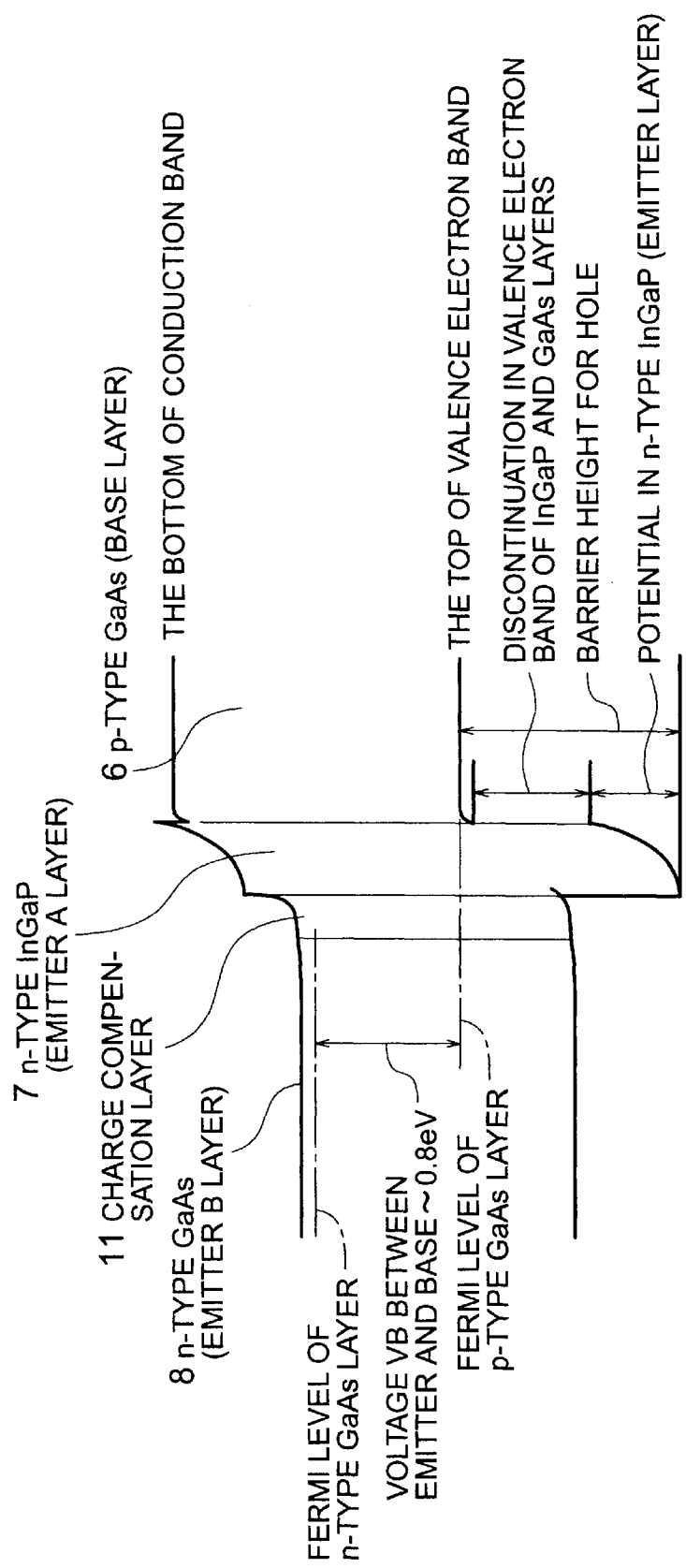
FIG. 8 demonstrates a schematic energy band diagram of part of layers in the structure shown in FIG. 1.

FIG. 8 is a schematic diagram of energy band of part of layers in an embodiment of this Invention shown in FIG. 1. These layers are the p-type GaAs layer (6) as the base layer, the n-type $In_xGa_{1-x}P$ layer (7) as the emitter A layer, the charge compensation layer (11) and the n-type GaAs layer (8) as the emitter B layer. As demonstrated in FIG. 8, the barrier against the hole is determined by the total of the band discontinuity of the top of the valence band between InGaP layer and the GaAs layer and the potential on the n-type InGaP layer.

Next, the barrier height of the InGaP layer that is necessary for holes at a VB of around 0.8 V is estimated from the I–V characteristics of HBT in FIG. 5.

FIG. 9 shows the results of calculation of the potential in the n-type InGaP layer (emitter layer) of FIG. 8 in relative to the doping amount of the charge compensation layer (product of multiplication of the doping concentration and the thickness of the charge compensation layer).

The emitter-base voltage was 0.8 V. The thickness of the n-type $In_xGa_{1-x}P$ layer (7) as the emitter A layer was 30 nm, the doping concentration was $5\times10^{17}$ $cm^{-3}$, the thickness of the charge compensation layer (11) was 5 nm and the doping concentration of the n-type GaAs layer (8) as the emitter B layer was $5\times10^{17}$ $cm^{-3}$. The barrier height for holes is the total of a potential in the n-type InGaP layer and a band discontinuity of the top of the valence band of the InGap and GaAs.

Although the bandgap energy changes depending on the degree of ordering of InGaP, it is said that the energy change at the bottom of the conduction band is much larger than energy change at the top of the valence band. The bandgap energy of the InGaP changes depending on the In composition. However, as lattice constant also changes, the In composition is ordinarily set at the value of around 0.48 at which the lattice constant of the emitter layer is coincident to the lattice constant of GaAs. Consequently, changes in band discontinuity of the top of the valence band between InGaP and GaAs of the emitter layer can be ignored, and changes of potential in the InGaP layer could be considered as main changes in barrier height for holes.

As a characteristic of the amount of carrier depletion, the charge density of fixed negative space charge at the heterojunction interface between the InGaP layer and GaAs layer was selected. It is shown that the barrier energy for holes decreases as the charge density at the heterojunction interface increases. Furthermore, the barrier height increases as the doping amount of the charge compensation layer increases. Calculation was performed using the Poisson's equation with depletion approximation.

The potential on the p-type GaAs base layer was ignored because the doping concentration of the layer was higher approximately by two figures. An energy difference between the bottom of the conduction band and Fermi level of the n-type GaAs layer, and an energy difference between the top of the valence band and Fermi level of the p-type GaAs layer were ignored. Although these ignorances actually cause a shift of the applied voltage of the emitter-base voltage, the essence of discussion below is not affected by the shift of about 0.1 V.

As regards the I–V characteristics of HBT in FIG. 5, it is desirable that the base current IB at a VB of around 0.8V decrease by one or more figures. There is the following relationship between the base current IB and the barrier height for holes ΔE (eV):

$$IB \propto EXP(q\Delta V/kT)$$

Therefore, it is desirable that the barrier height is relatively increased by about 0.06 eV.

Based on the measurement of the capacity between the emitter and base of HBT element that was used for the measurement shown in FIG. 5, the charge density at the heterojunction interface between the InGaP layer and GaAs layer was estimated approximately $1\times10^{12}$ cm$^{-2}$ as the amount of depletion.

In FIG. 9, the doping amount of the charge compensation layer of $2.5\times10^{11}$ cm$^{-2}$ corresponds to the carrier concentration of $5\times10^{17}$ cm$^{-3}$, which is the same as no existense of charge compensation layer (11). Therefore, based on FIG. 9, it is estimated that the potential of the InGaP layer of the sample in FIG. 4 is slightly less than 0.46 eV. Subsequently, in order to decrease base current IB by one figure, the potential in the InGaP layer should be not less than 0.52 eV. As the value is not critical, it is desirable to be higher.

As the doping amount of the charge compensation layer increases, the emitter capacity increases and reverse breakdown voltage between the emitter and base decreases. FIG. 10B shows the reverse I–V characteristics between the emitter and base of HBT when the n-type GaAs above the n-type InGaP layer as the emitter A layer has a Si impurity (dopant) concentration of $3\times10^{18}$ cm$^{-3}$ and a thickness of the layer of 100 nm. The characteristics of FIG. 10B show decrease in breakdown voltage in comparison with the characteristics of FIG. 11B where the charge compensation has an appropriate doping amount. The barrier height at this time is calculated 0.63 eV, suggesting that even though the barrier height is increased by inserting the charge compensation layer, the reverse breakdown voltage between emitter and base decreases. Therefore, it is desirable that the barrier height is not higher than 0.63 eV.

Figure 12:
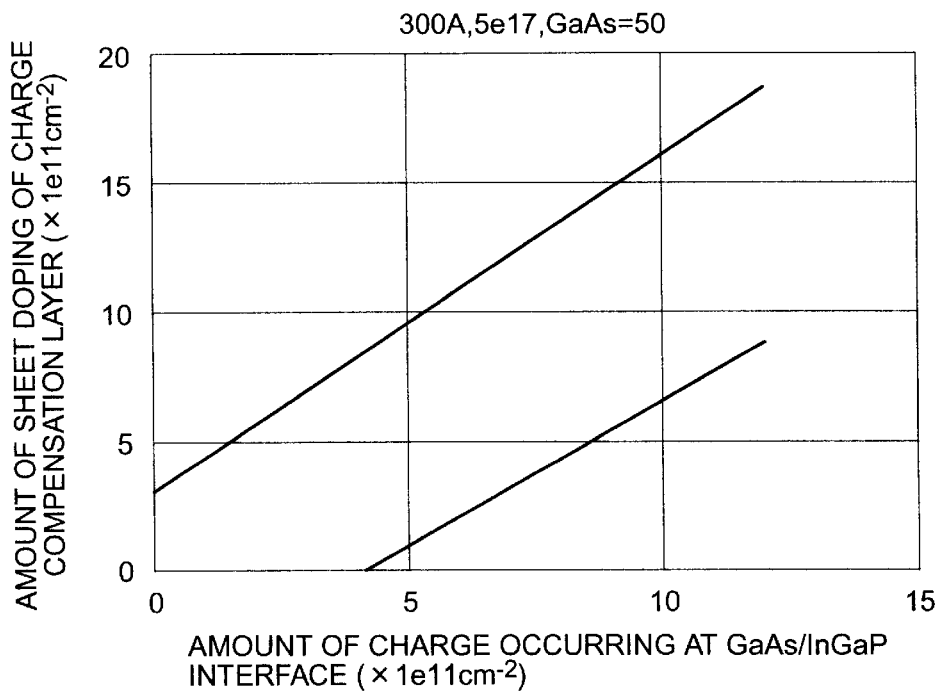
FIG. 12 is a graph to explain the range of the amount of sheet doping of the appropriate charge compensation layer.

In FIG. 12, the doping amount (doping density×thickness) of the highly doped layer (charge compensation layer) when potential in the n-type InGaP layer as the emitter is 0.52 eV (lower line) and 0.63 eV (higher line) is plotted against the effective charge amount at the heterojunction interface between the GaAs and InGap layers that is induced by formation of natural superlattice of InGaP and calculated based on FIG. 9. When the charge compensation layer is manufactured with conditions between these two lines, base current is prevented from increasing while reverse breakdown voltage between the emitter and base is maintained.

As described above, depending on the degree of ordering of natural superlattice, the band edge energy of InGaP measured from photoluminescence shifts and the amount of effective charge at the heterojunction interface increases. No quantitative correlation is clear between the amount of shift of band edge emission energy of the InGaP measured from photoluminescence and the amount of effective charge at the heterojunction interface, upon the formation of natural superlattice. However, it is sufficient for the purpose of industrial practicality to consider it a first order correlation.

A sample shown in FIG. 4 has a band edge emission energy of the InGaP layer measured from photoluminescence of 0.072 eV and an effective charge density at the heterojunction interface of approximately $1\times10^{12}$ cm$^{-2}$. Therefore, the effective charge density at the heterojunction interface is $$1\times10^{12} \times \Delta Eg/0.072$$

wherein ΔEg (eV) is the shift amount of band edge emission energy of InGaP measured from photoluminescence. In approximation based on FIG. 12 with the axis of abscissas converted to ΔEg, the doping amount Ns (cm$^{-2}$) of the charge compensation layer can be adjusted in a range of $$(180 \times \Delta Eg+3.0) \times 1E11 > Ns > (160 \times \Delta Eg-4.6) \times 1E11.$$

Figure 13:
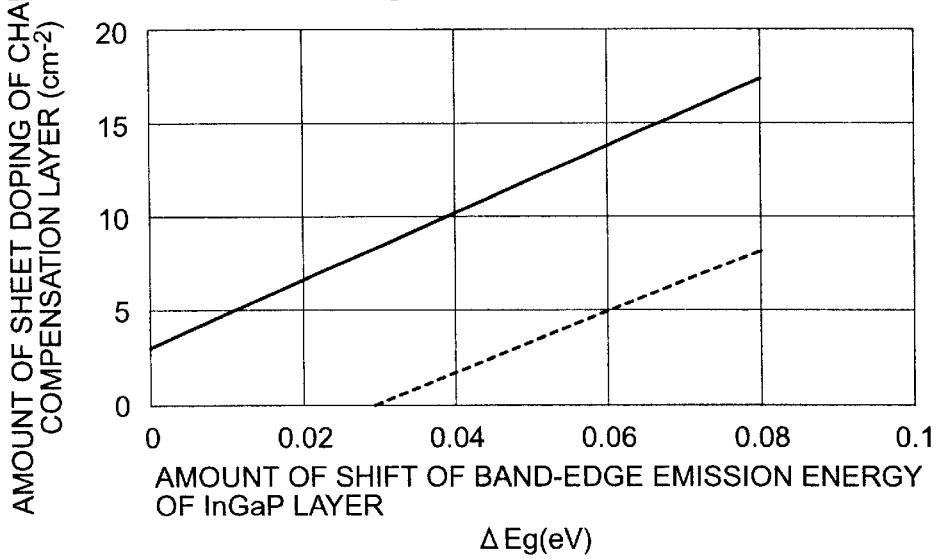
FIG. 13 is a graph showing a relationship between the amount of doping of the charge compensation layer and ΔEg.

FIG. 13 shows results of plotting of the upper and lower limits of sheet doping amount of the charge compensation layer against ΔEg. When ΔEg is less than about 0.03 eV, the charge compensation layer becomes unnecessary. However, as the upper limit is never exceeded, doping can be performed below the upper limit.

In the above embodiment of FIGS. 12 and 13, the following is made a proviso:
(1) The thickness of the n-type InGaP layer as the emitter A layer is 30 nm,
(2) The doping concentration of the InGaP layer as the emitter A layer is $5\times10^{17}$ cm$^{-3}$.
(3) The thickness of the charge compensation layer is 5 nm, and
(4) The doping concentration of the n-type GaAs layer as the emitter B layer is $5\times10^{17}$ cm$^{-3}$.

Barrier height of the emitter A layer against hole depends on the above-listed four design parameters. The upper and lower limits of the doping amount of the charge compensation layer is calculated, when the effective charge amount occurring the heterojunction interface between the GaAs and InGaP layers is $1\times10^{12}$ cm$^{-2}$.

Figure 14:
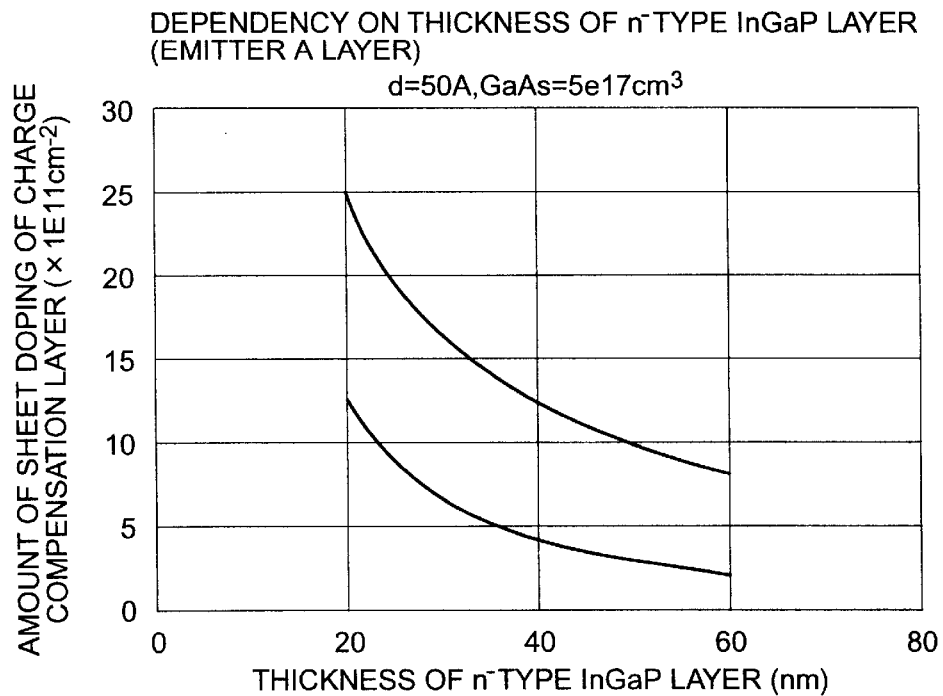
FIG. 14 is a graph to explain a dependency of the range of the amount of sheet doping of the appropriate charge compensation on the emitter A layer thickness.

FIG. 14 shows the dependency of the upper and lower limits of sheet doping amount of the charge compensation layer on the thickness of the n-type InGaP layer (7) as the emitter A layer. When dInGaP is the thickness (nm) of the n-type In$_x$Ga$_{1-x}$P layer (7) as the emitter A layer, the correction factor of the upper limit is approximated to $$(d\text{InGaP}/30)^{\wedge}(-1.0)$$

and the correction factor of the lower limit is approximated to $$(d\text{InGaP}/30)^{\wedge}(-1.56).$$

Figure 15:
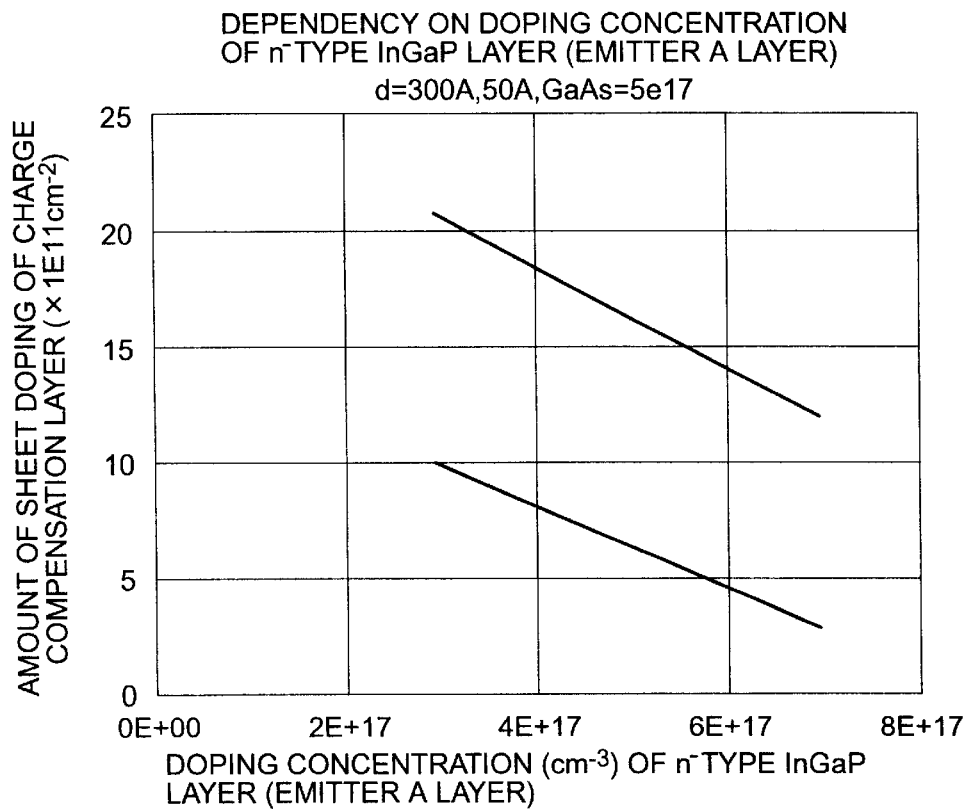
FIG. 15 is a graph to explain a dependency of the range of the amount of sheet doping of the appropriate charge compensation on the emitter A layer doping concentration.

FIG. 15 shows the dependency of the upper and lower limits of sheet doping amount of the charge compensation layer on the doping concentration of the n-type In$_x$Ga$_{1-x}$P layer (7) as the emitter A layer. When Ndemitter is the doping concentration (cm$^{-3}$) of the n-type In$_x$Ga$_{1-x}$P layer (7) as the emitter A layer, the correction factor of the upper limit is approximated to $$(-2.1E-17 \times \text{Ndemitter}+26.8)/16.2,$$

and the correction factor of the lower limit is approximated to $$(-1.7E-18 \times \text{Ndemitter}+14.9)/6.5.$$

Figure 16:
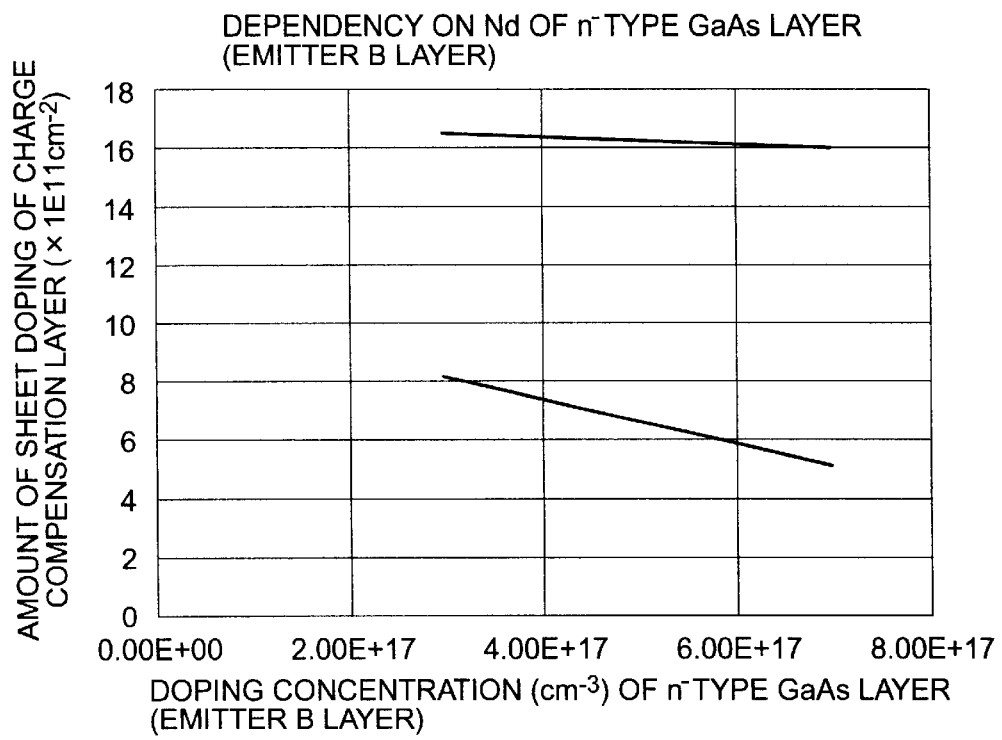
FIG. 16 is a graph to explain a dependency of the range of the amount of sheet doping of the appropriate charge compensation on the emitter B layer doping concentration.

FIG. 16 shows the dependency of the upper and lower limits of sheet doping amount of the charge compensation layer on the doping concentration of the n-type GaAs layer (8) as the emitter B layer. When NdGaAs is the doping concentration (cm$^{-3}$) of the n-type GaAs layer (8) as the emitter B layer, the correction factor of the upper limit is approximated to 1, and the correction factor of the lower limit is approximated to $(-7.5e-18 \times \text{NdGaAs}+10.4)/6.6$.

Figure 17:
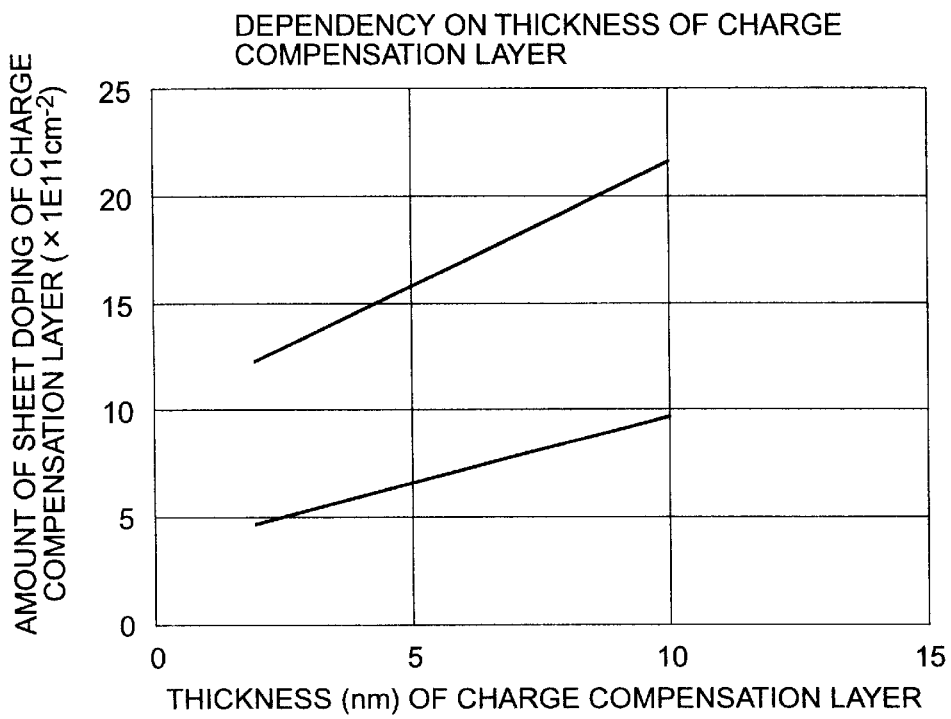
FIG. 17 is a graph to explain a dependency of the range of the amount of sheet doping of the appropriate charge compensation on the thickness of the charge compensation layer.

FIG. 17 is a graph demonstrating the dependency of the upper and lower limits of sheet doping amount of the charge compensation layer on the thickness of the charge compensation layer. When the thickness (nm) of the charge compensation layer is dn+GaAs,
the correction factor of the upper limit is (1.2×dn+GaAs+9.8)/15.7 and the correction factor of the lower limit is (0.61×dn+GaAs+3.5)/6.6.

Using the above calculations, the sheet doping amount Ns ($cm^{-2}$) of the charge compensation layer is (180×ΔEg+3.0)×1E11×C1>Ns>(160×ΔEg−4.6)×1E11×C2.

wherein ΔEg=(1.92−Eg−1×Δy).

(Eg is bandgap energy (eV) of the first layer at room temperature, and correction of 1×Δy is a correction term of the band edge emission energy depending on In composition of InGaP. Δy is obtained by subtracting the In-composition when lattice constant of the first layer coincides with that of the second layer from the In composition of the first layer. The coefficient C1 is ((dInGaP/30)^(−1.0))×(−2.1E−17×Ndemitter+26.8)/16.2×(1.2×dn+GaAs+9.8)/15.7 and
the coefficient C2 is ((dInGaP/30)^(−1.59))×(−1.7E−18×Ndemitter+14.9)/6.5×(0.61×dn+GaAs+3.5)/6.6×(−7.5E−18×NdGaAs+10.4)/6.6.

wherein
dInGaP is the thickness (nm) of the first layer,
Ndemitter is the carrier concentration ($cm^{-3}$) of the first layer,
dn+GaAs is the thickness (nm) of the charge compensation layer, and
NdGaAs is the carrier concentration ($cm^{-3}$) of the second layer.

Based on the relationship of the thickness and sheet doping amount of the charge compensation layer shown in FIG. 17, when the doping concentration of the charge compensation layer is fixed, a straight line through the origin is made. Doping concentration up to $5 \times 10^{17}$ $cm^{-3}$ does not cross with the lower limit. When the concentration of the charge compensation layer is $1 \times 10^{18}$ $cm^{-3}$, the lower limit is reached with a thickness of 10 nm. Therefore, the doping concentration of the charge compensation layer should be not less than $1 \times 10^{18}$ $cm^{-3}$.

Figure 18:
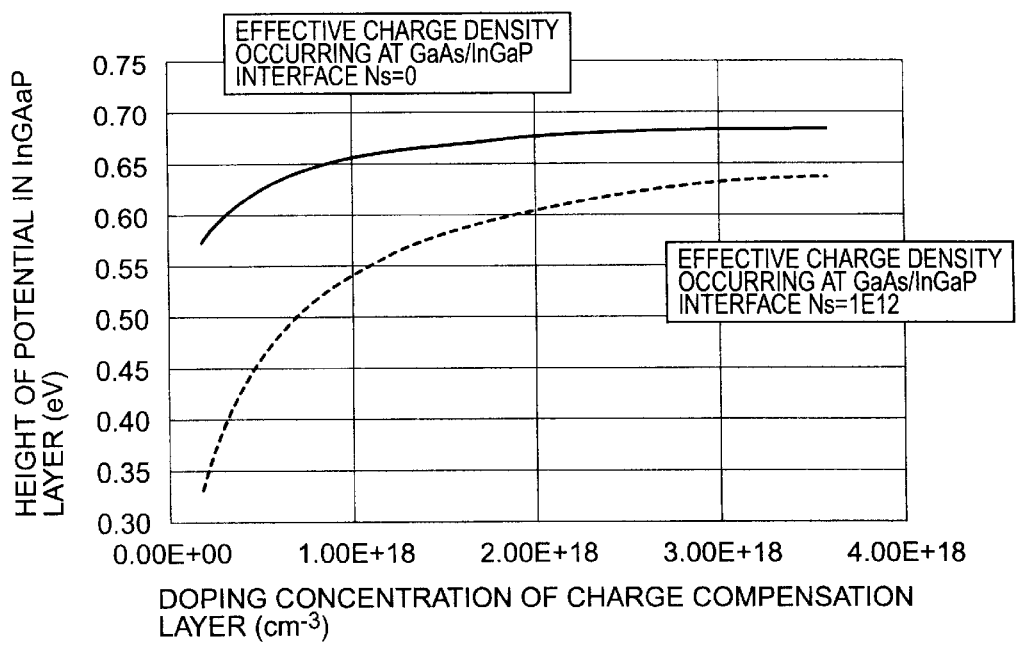
FIG. 18 is a graph to explain a relationship between the potential in the InGaP layer and the concentrations of doping when the charge compensation layer is sufficiently thick.

FIG. 18 shows the results of calculation of the dependency of potential height in the InGaP layer on the doping concentration of the charge compensation layer when the thickness of the charge compensation layer is sufficient. The results indicate that once the charge density of the heterojunction interface between the InGap and GaAs layers induced by ordering of the InGaP layer becomes $1 \times 10^{12}$ $cm^{-2}$, the potential in the InGaP layer does not reach 0.52 eV, even if the thickness of the charge compensation layer is increased, if the doping concentration is not more than $1 \times 10^{18}$ $cm^{-3}$. Therefore, it is desirable that the doping concentration of the charge compensation layer be $1 \times 10^{18}$ $cm^{-3}$.

When it is assumed that the charge compensation layer has a doping concentration of $1 \times 10^{18}$ $cm^{-3}$ and the layer is sufficiently thick, the thickness of the depletion layer is 15 nm. It is unnecessary for the charge compensation layer to be thicker than this thickness. However, if the layer is too thin, it is difficult to control the thickness. Therefore, it is preferably not less than 1 nm.

Based on FIG. 14, when the InGaP layer is 60 nm or more in thickness, the lower limit of the doping concentration is approximately $5 \times 10^{17}$ $cm^{-3}$. Then, the charge compensation layer becomes unnecessary. However, from the demands of the process for formation of base electrodes, it is desirable for the thickness of the InGaP layer to be as thin as possible, as long as the characteristics of HBT do not deteriorate. Ordinarily, the thickness of the InGaP emitter layer is about 30 nm. Insertion of the charge compensation layer (11) becomes necessary when the thickness of the InGaP emitter layer is not more than 60 nm.

In the embodiments of the invention described above, the case where the n-type $In_xGa_{1-x}P$ layer is the emitter A layer and the $n^+$-type GaAs layer is the charge compensation layer is explained. The structure of the thin film crystal wafer (1) is not limited to these embodiments. That is, the emitter A layer and the charge compensation layer can be formed as a first conductivity type compound semiconductor crystal layer that are a 3-5 group compound semiconductor represented by the general formula: $In_xGa_yAl_zP$ and $In_xGa_yAl_zAs$ ($0 \leq x \leq 1$, $0 \leq y \leq 1$, $0 \leq z \leq 1$, x+y+z=1). Consequently, for example, the emitter A layer can be an InGaP layer and the charge compensation layer an AlGaAs layer. The same effects described above can be also expected.

Next, the Examples of a thin film crystal wafer (1) with a structure shown in FIG. 1 are explained.

EXAMPLE 1

A thin film crystal wafer was produced as shown in FIG. 19 for carrier concentrations, dopant and thickness of layers and In composition. The band edge emission energy of the n-type $In_xGa_{1-x}P$ layer (7) was 1.85 eV in a measurement with photoluminescence. Its In composition was 0.48. Its lattice constant was coincident to the lattice constant of GaAs. ΔEg was 0.07 eV. The sheet doping amount of the charge compensation layer (11) was $0.9 \times 10^{12}$ $cm^{-2}$.

Figure 11A:
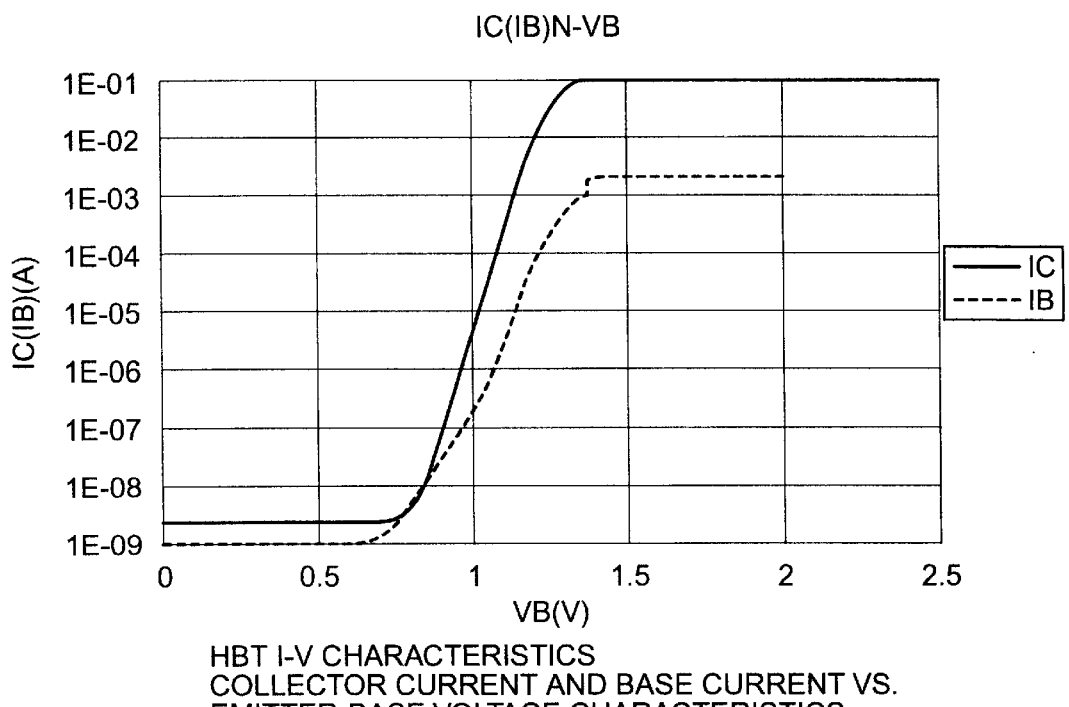
FIGS. 11A and 11B are graphs demonstrating transistor characteristics of HBT in Example 1.
Figure 11B:
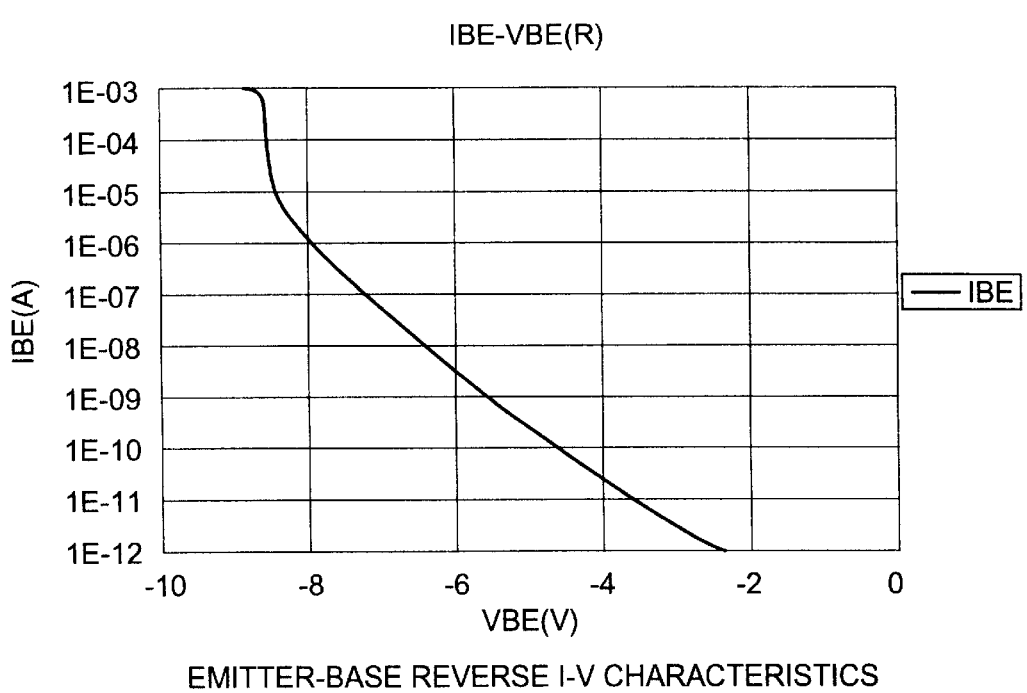

FIG. 11 shows measurement results of characteristics of HBT with the thin film crystal wafer thus produced. FIG. 11 demonstrates that base current IB was sufficiently suppressed around VB=0.8 V and breakdown voltage resistance between the base and emitter was good.

EXAMPLE 2

A thin film crystal wafer was produced as shown in FIG. 20 for carrier concentrations, dopant and thickness and In composition. The band edge emission energy of the n-type $In_xGa_{1-x}P$ layer (7) was 1.85 eV in a measurement with photoluminescence. Its In composition was 0.48 with lattice commensurate to GaAs. ΔEg was 0.07 eV. The sheet doping amount of the charge compensation layer (11) was $1.5 \times 10^{12}$ $cm^{-2}$.

Figure 21A:
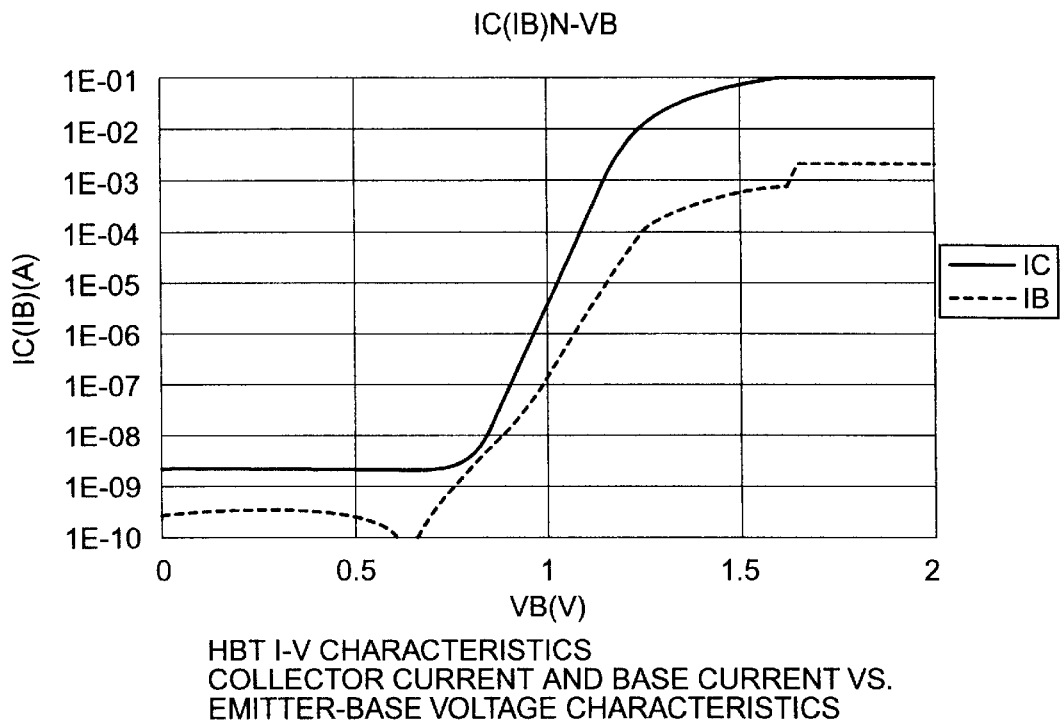
FIGS. 21A and 21B are graphs demonstrating transistor characteristics of HBT in Example 2.
Figure 21B:
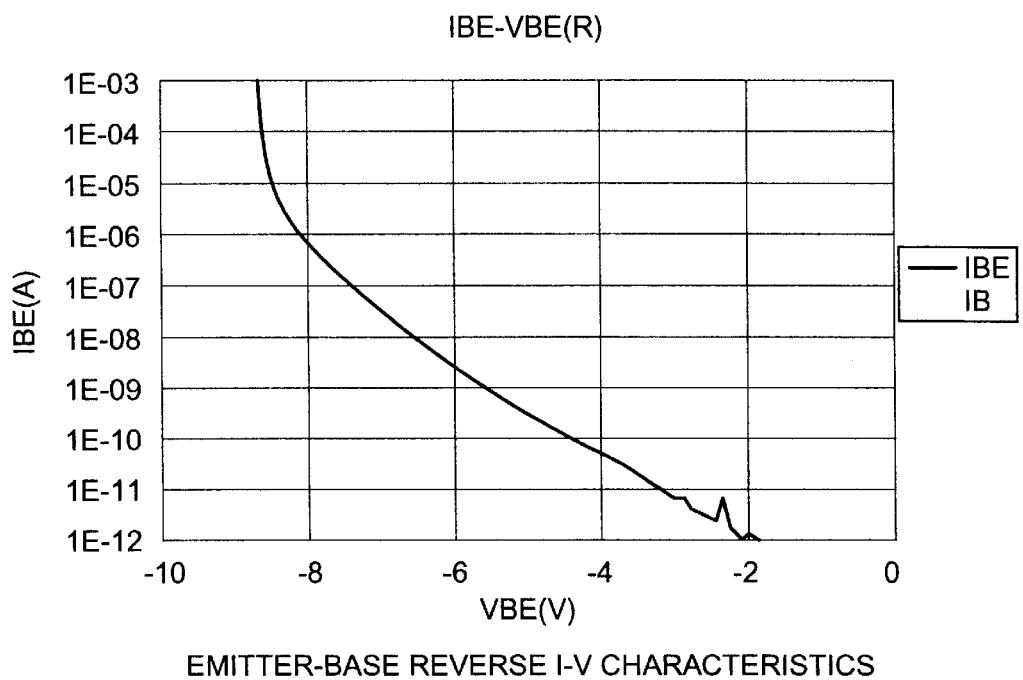

FIG. 21 shows measurement results of HBT characteristics of HBT with the thin film crystal wafer produced in the manner described above. FIG. 21 demonstrates that base current IB was further suppressed and accordingly improved around VB=0.8V and reverse breakdown voltage between the base and emitter was not deteriorated.

COMPARATIVE EXAMPLE 1

In order to confirm the effects seen in Example 1, a thin film crystal wafer with a structure without a charge compensation layer shown in FIG. 4 was produced with parameters shown in FIG. 22 for carrier concentration, dopant and thickness and In composition of each layer. The band edge emission energy of the n-type $In_xGa_{1-x}P$ layer (7) was 1.85 eV in a measurement with photoluminescence. Its In composition was 0.48. Its lattice constant was coincident to the lattice constant of GaAs. ΔEg was 0.07 eV.

Figure 23A:
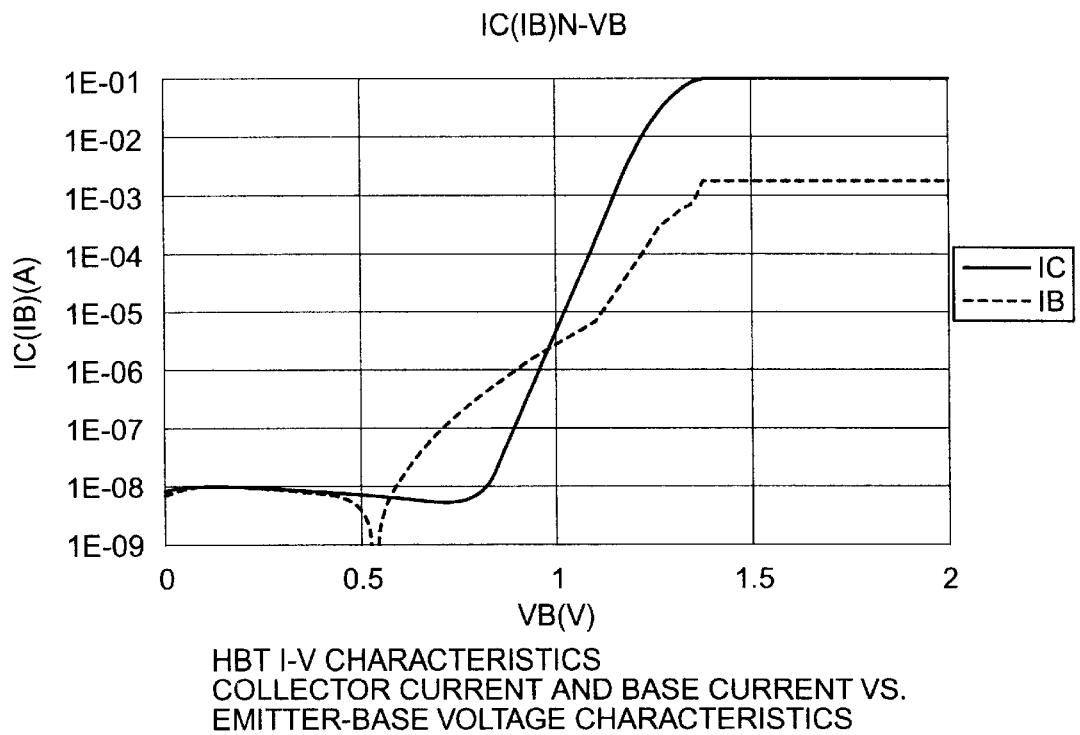
FIG. 23 is a graph demonstrating results of measurement of HBT transistor characteristics in Comparative Example 1.
Figure 23B:
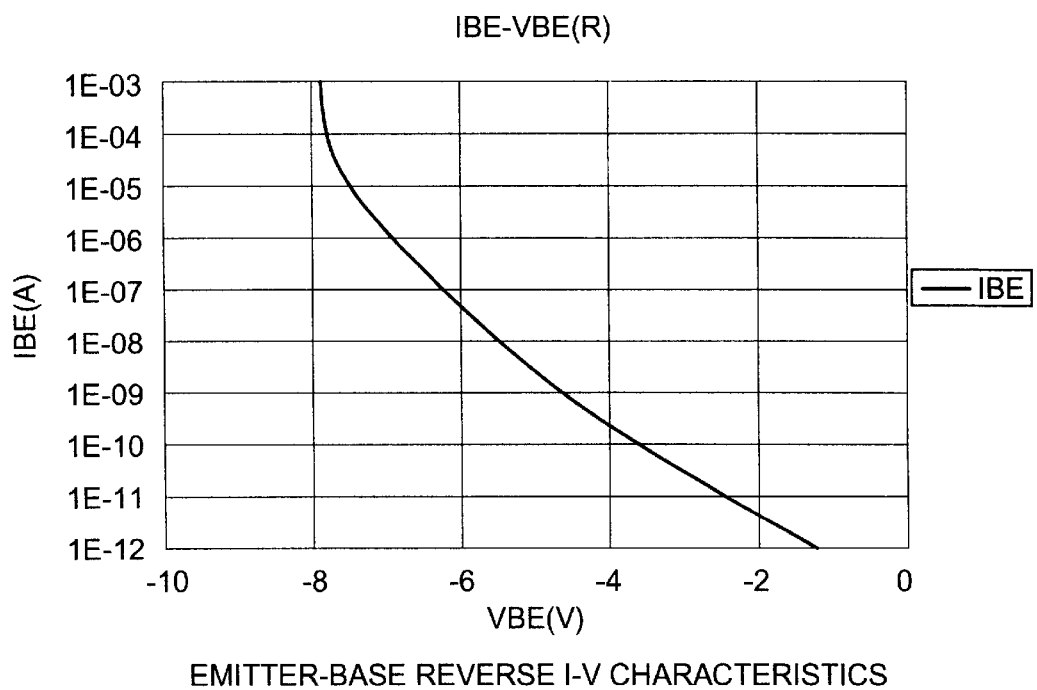

FIG. 23 shows measurement results of characteristics of HBT with the thin film crystal wafer thus produced. FIG. 23 demonstrates that while reverse breakdown voltage between the base and emitter was satisfactory, the base current IB was increased around VB=0.8 V. Thus, HBT characteristics were deteriorated as compared to the wafer with the charge compensation layer.

COMPARATIVE EXAMPLE 2

In order to confirm the effects seen in Example 2, a thin film crystal wafer with a structure without a charge compensation layer shown in FIG. 4 was produced with parameters shown in FIG. 24 for carrier concentrations, dopant and thickness and In composition of each layer. The band edge emission energy of the n-type $In_xGa_{1-x}P$ layer (7) was 1.85 eV in a measurement with photoluminescence. Its In composition was 0.48 with lattice commensurate to GaAs. ΔEg was 0.07 eV.

Figure 10A:
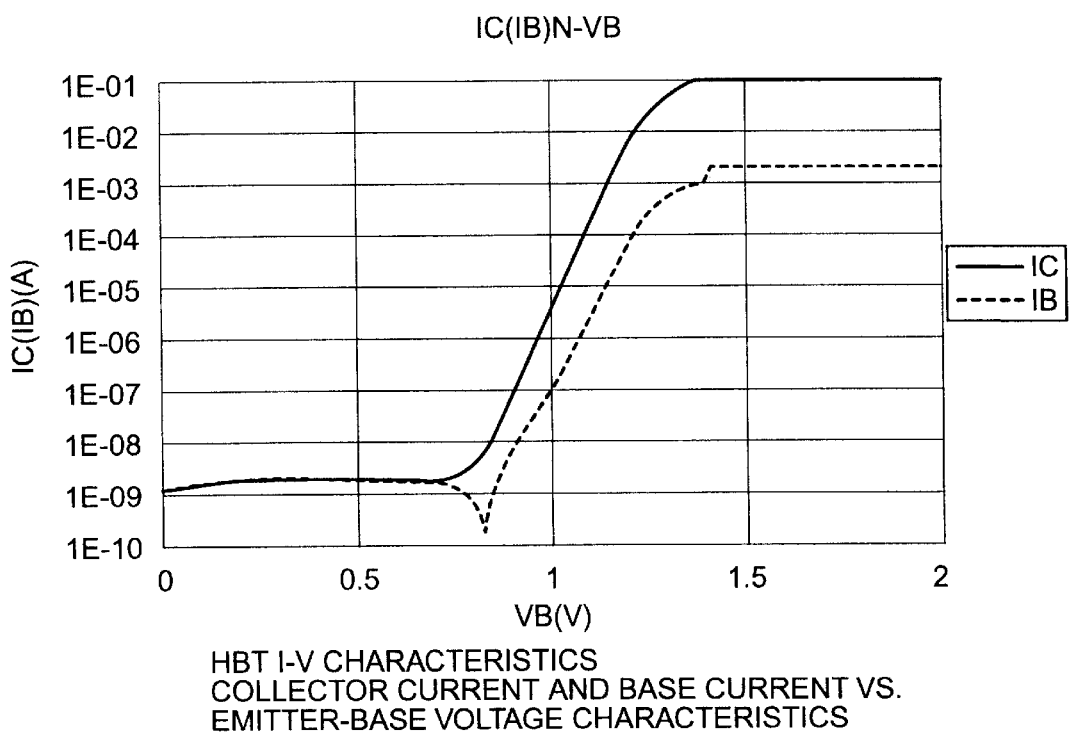
FIGS. 10A and 10B are graphs demonstrating results of measurement of HBT transistor characteristics in Comparative Example 2.
Figure 10B:
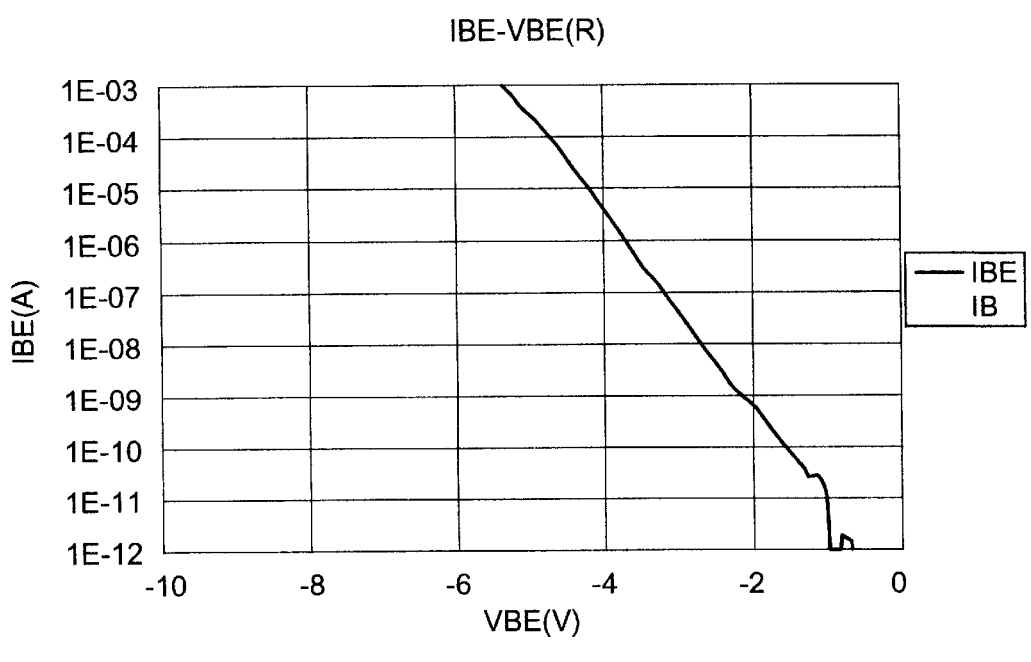

FIG. 10 shows measurement results of properties of HBT with the thin film crystal wafer thus produced. This HBT has an epistructure equivalent to that having a charge compensation layer with excessive doping amount. FIG. 10 demonstrates that while base current IB was suppressed around VB=0.8 V, reverse breakdown voltage between the base and emitter was decreased.

What is claimed is:

1. A thin film crystal wafer with pn-junction comprising a first layer of a first conductivity type which is a 3-5 group compound semiconductor represented by a general formula: $In_xGa_yAl_zP$ ($0 \leq x \leq 1$, $0 \leq y \leq 1$, $0 \leq z \leq$, x+y+z=1), and the second layer of the first conductivity type which is a 3-5 group compound semiconductor represented by a general formula: $In_xGa_yAl_zAs$ ($0 \leq x \leq 1$, $0 \leq y \leq 1$, $0 \leq z \leq 1$, x+y+z=1), said second layer being made above said first layer, and at a heterojunction interface formed between said first layer and said second layer, further comprising a charge compensation layer of a first conductivity type with an impurity concentration higher than that of said first and second layers, and the thickness of said charge compensation layer is not less than 1 nm and not more than 15 nm;

wherein a carrier concentration and thickness of said charge compensation layer are controlled depending on a bandgap energy of said first layer.

2. A thin film crystal wafer with pn-junction according to claim 1, further comprising a collector layer and a base layer, wherein said first layer is a semiconductor layer which serves as an emitter layer with a band gap larger than said base layer.

3. A thin film crystal wafer with pn-junction according to claim 1 or 2, wherein said first layer is an n-type InGaP layer and said second layer is an n-type $Al_xGa_yAs$ layer ($0 \leq x \leq 1$, $0 \leq y \leq 1$, x+y=1).

4. A thin film crystal wafer with pn-junction according to claims 1 or 2, wherein said first conductivity type is an n-type and an n-type impurity is Si.

5. A thin film crystal wafer with pn-junction according to claims 1 or 2, wherein the impurity concentration of said charge compensation layer is greater than $1 \times 10^{18}$ cm$^{-3}$.

6. A thin film crystal wafer with pn-junction according to claims 1 or 2, wherein said first layer has a thickness of not more than 60 nm.

7. A thin film crystal wafer with pn-junction according to claims 1 or 2, wherein sheet doping amount Ns (cm$^{-2}$) that is a product of carrier concentration and thickness of said charge compensation layer satisfies:

$$(180 \times \Delta Eg + 3.0) \times 1E11 \times C1 > Ns > (160 \times \Delta Eg - 4.6) \times 1E11 \times C2$$

wherein

ΔEg=(1.92−(Eg+1×Δy)),

C1=((dInGaP/30)^(−1.0))×(−2.1E−17×Ndemitter+26.8)/16.2×(1.2×dn+GaAs+9.8)/15.7

C2=((dInGaP/30)^(−1.59))×(−1.7E−18×Ndemitter+14.9)/6.5×(0.61×dn+GaAs+3.5)/6.6×(−7.5E−18×NdGaAs+10.4)/6.6 wherein

Eg is a bandgap energy of the first layer at room temperature (eV),

Δy is obtained by subtracting a value of In composition of the first layer when the first layer coincides with the second layer in lattice constants from a value of the In composition of said first layer, dInGaP is a thickness of the first layer (nm), Ndemitter is a carrier concentration of the first layer (cm$^{-3}$), dn+GaAs is a thickness of a charge compensation layer (nm), and NdGaAs is a carrier concentration of the second layer (cm$^{-3}$).

8. A thin film crystal wafer with pn-junction according to claims 1 or 2, wherein epitaxial growth of each of said layers is performed in organometal vapor-phase growth method.

* * * * *